US009847758B2

(12) United States Patent
Bokui et al.

(10) Patent No.: US 9,847,758 B2
(45) Date of Patent: Dec. 19, 2017

(54) LOW NOISE AMPLIFIER

(71) Applicant: SOCIONEXT INC., Kanagawa (JP)

(72) Inventors: Takahiro Bokui, Osaka (JP); Hiroshi Kimura, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/278,949

(22) Filed: Sep. 28, 2016

(65) Prior Publication Data

US 2017/0019074 A1 Jan. 19, 2017

Related U.S. Application Data

(63) Continuation of application No. PCT/JP2015/000097, filed on Jan. 13, 2015.

(30) Foreign Application Priority Data

Mar. 28, 2014 (JP) .................................. 2014-069853

(51) Int. Cl.
*H03F 3/45* (2006.01)
*H03F 1/26* (2006.01)
(Continued)

(52) U.S. Cl.
CPC ............ *H03F 1/26* (2013.01); *H03F 1/0205* (2013.01); *H03F 1/3211* (2013.01); *H03F 3/45179* (2013.01); *H03F 3/45197* (2013.01); *H03F 3/45206* (2013.01); *H03F 3/45* (2013.01); *H03F 3/45071* (2013.01); *H03F 3/45183* (2013.01); *H03F 2200/294* (2013.01);
(Continued)

(58) Field of Classification Search
CPC ...... H03F 1/26; H03F 1/3211; H03F 3/45197; H03F 3/45; H03F 3/45179; H03F 3/45183; H03F 3/45188; H03F 3/45192; H03F 2200/177; H03F 3/45071; H03F 2203/30063
USPC ................................. 330/277, 253, 254, 261
See application file for complete search history.

(56) References Cited

U.S. PATENT DOCUMENTS 6,118,340 A     9/2000 Koen
7,088,179 B2 *  8/2006 Gilbert ...................... H03F 1/26
                                                 330/254

(Continued)

FOREIGN PATENT DOCUMENTS

JP    2007-043654 A    2/2007
JP    2010-034786 A    2/2010

OTHER PUBLICATIONS

International Search Report issued in International Patent Application No. PCT/JP2015/000097, dated Mar. 24, 2015; with English translation.

*Primary Examiner* — Khanh V Nguyen
(74) *Attorney, Agent, or Firm* — McDermott Will & Emery LLP

(57) ABSTRACT

A low noise amplifier includes: first and seventh transistors configured to respectively receive first and second input signals; second, third, and fifth transistors connected to the first transistor; eighth, ninth, and eleventh transistors connected to the seventh transistor; a third resistive element; fourth and tenth transistors respectively connected to the third and ninth transistors; sixth and twelfth transistors respectively connected to second and first output terminals; and first and second resistive elements.

11 Claims, 17 Drawing Sheets

(51) Int. Cl.
*H03F 1/02* (2006.01)
*H03F 1/32* (2006.01)

(52) U.S. Cl.
CPC .. *H03F 2200/513* (2013.01); *H03F 2200/555* (2013.01); *H03F 2203/45494* (2013.01)

(56) References Cited

U.S. PATENT DOCUMENTS

| | | | | |
|---|---|---|---|---|
| 7,466,199 | B2 * | 12/2008 | Blon | H03F 1/0205 330/255 |
| 7,592,870 | B2 * | 9/2009 | Wang | H03F 1/26 330/258 |
| 7,911,274 | B2 * | 3/2011 | Morikawa | H03F 3/45197 330/253 |
| 2007/0018725 | A1 | 1/2007 | Morikawa et al. | |
| 2009/0015330 | A1 | 1/2009 | Morikawa et al. | |
| 2009/0058522 | A1 | 3/2009 | Sugihara et al. | |

* cited by examiner

LOW NOISE AMPLIFIER

CROSS-REFERENCE TO RELATED APPLICATIONS

This is a continuation of International Application No. PCT/JP2015/000097 filed on Jan. 13, 2015, which claims priority to Japanese Patent Application No. 2014-069853 filed on Mar. 28, 2014. The entire disclosures of these applications are hereby incorporated by reference.

BACKGROUND

The present disclosure relates to a low noise amplifier, and more particularly, to a technique for reducing power consumption.

Low noise amplifiers for use in various electronic devices have been required to have their characteristics improved such that those amplifiers have as low noise and as low distortion as possible. Also, demands have been increasing year after year for electronic devices operating at a low power, and interests have been growing in reducing the power consumption of those low noise amplifiers in addition to improving such characteristics of theirs.

A known low noise amplifier capable of operating at a low power with low noise and low distortion amplifies and outputs a difference between two input signals (see, e.g., FIG. 5 of U.S. Pat. No. 6,118,340). This low noise amplifier is configured as a relatively simple circuit, and may operate at lower power than the amplifier with the configuration shown in FIG. 3 of U.S. Pat. No. 6,118,340.

SUMMARY

Nowadays, there have been increasing demands for electronic devices operating at an even lower power. Thus, it can be said that low noise amplifiers for use in electronic devices should also be operated at a still lower power.

However, the low noise amplifier described above may have some difficulty in further reducing its power consumption although it may maintain relatively good noise and distortion characteristics.

In view of the foregoing background, it is therefore an object of the present disclosure to provide a low noise amplifier capable of operating at a still lower power while maintaining good noise and distortion characteristics.

To overcome the problem described above, the present disclosure provides the following solutions. Specifically, the present disclosure provides a first low noise amplifier which receives first and second input signals and outputs first and second output signals and which includes: a first transistor configured to receive the first input signal at its gate; a second transistor having its gate biased, its source electrically connected to a first potential, and its drain electrically connected to a drain of the first transistor; a third transistor having its gate biased and its source electrically connected to the drain of the first transistor; a fourth transistor having its gate biased, its source electrically connected to a second potential, and its drain electrically connected to a drain of the third transistor; a fifth transistor having its gate electrically connected to the drain of the fourth transistor, its source electrically connected to the second potential, and its drain electrically connected to a source of the first transistor; a sixth transistor having its gate electrically connected to the drain of the fourth transistor, its source electrically connected to the second potential, and its drain electrically connected to a second output terminal configured to output the second output signal; a first resistive element, one terminal of which is electrically connected to the first potential and the other terminal of which is electrically connected to the second output terminal; a seventh transistor configured to receive the second input signal at its gate; an eighth transistor having its gate biased, its source electrically connected to the first potential, and its drain electrically connected to a drain of the seventh transistor; a ninth transistor having its gate biased and its source electrically connected to the drain of the seventh transistor; a tenth transistor having its gate biased, its source electrically connected to the second potential, and its drain electrically connected to a drain of the ninth transistor; an eleventh transistor having its gate electrically connected to the drain of the tenth transistor, its source electrically connected to the second potential, and its drain electrically connected to a source of the seventh transistor; a twelfth transistor having its gate electrically connected to the drain of the tenth transistor, its source electrically connected to the second potential, and its drain electrically connected to a first output terminal configured to output the first output signal; a second resistive element, one terminal of which is electrically connected to the first potential and the other terminal of which is electrically connected to the first output terminal; and a third resistive element electrically connected to the source of the first transistor and the source of the seventh transistor.

According to this, the first low noise amplifier includes a first path formed by the first, second and fifth transistors between the first and second potentials, and a second path formed by the first resistive element and the sixth transistor between the first and second potentials. The current flowing through the first path flows through the second path in a mirror pattern.

The first low noise amplifier also includes a third path formed by the seventh, eighth and eleventh transistors between the first and second potentials, and a fourth path formed by the second resistive element and the twelfth transistor between the first and second potentials. The current flowing through the third path flows through in the fourth path in a mirror pattern.

The low noise amplifier disclosed in FIG. 5 of U.S. Pat. No. 6,118,340 has a differential configuration in which two paths are formed between a power supply potential and a ground potential such that each of the two paths includes a resistive element and three transistors which are connected together in series.

Suppose that, e.g., the above-described two low noise amplifiers operate at a low voltage to reduce their power consumption.

In the configuration of FIG. 5 of U.S. Pat. No. 6,118,340, if the operating voltage is lowered, an input dynamic range may be insufficient for the amplitude of the input signal since the circuit receiving a signal and the circuit outputting the signal form a cascade configuration and a large number of elements are connected together between the power supply and the ground.

In contrast, according to the first low noise amplifier, even if its operating voltage is lowered, an input dynamic range is still sufficient for the amplitude of the input signal. This is because the first and third paths through which the input signal is supplied are separated from the second and fourth paths through which the output signal is output, and a smaller number of elements are disposed between the first and second potentials. Accordingly, the operation at such a low voltage may achieve further reduction in power consumption.

The gain obtained by the first low noise amplifier depends on respective resistance values of the first to third resistive elements and respective sizes of the fifth, sixth, eleventh, and twelfth transistors, not on the transconductance of any transistor. Thus, good distortion characteristics may be maintained.

Alternatively, a second low noise amplifier according to the present disclosure receives first and second input signals and outputs first and second output signals and may include: a first transistor configured to receive the first input signal at its gate; a second transistor having its gate biased, its source electrically connected to a first potential, and its drain electrically connected to a drain of the first transistor; a third transistor having its gate electrically connected to the drain of the first transistor and its drain electrically connected to the first potential; a fourth transistor having its gate biased, its source electrically connected to a second potential, and its drain electrically connected to a source of the third transistor; a fifth transistor having its gate electrically connected to the drain of the fourth transistor, its source electrically connected to the second potential, and its drain electrically connected to a source of the first transistor; a sixth transistor having its gate electrically connected to the drain of the fourth transistor, its source electrically connected to the second potential, and its drain electrically connected to a second output terminal configured to output the second output signal; a first resistive element, one terminal of which is electrically connected to the first potential and the other terminal of which is electrically connected to the second output terminal; a seventh transistor configured to receive the second input signal at its gate; an eighth transistor having its gate biased, its source electrically connected to the first potential, and its drain electrically connected to a drain of the seventh transistor; a ninth transistor having its gate electrically connected to the drain of the seventh transistor and its drain electrically connected to the first potential; a tenth transistor having its gate biased, its source electrically connected to the second potential, and its drain electrically connected to a source of the ninth transistor; an eleventh transistor having its gate electrically connected to the drain of the tenth transistor, its source electrically connected to the second potential, and its drain electrically connected to a source of the seventh transistor; a twelfth transistor having its gate electrically connected to the drain of the tenth transistor, its source electrically connected to the second potential, and its drain electrically connected to a first output terminal configured to output the first output signal; a second resistive element, one terminal of which is electrically connected to the first potential and the other terminal of which is electrically connected to the first output terminal; and a third resistive element electrically connected to the source of the first transistor and the source of the seventh transistor.

Still alternatively, a third low noise amplifier according to the present disclosure receives first and second input signals and outputs first and second output signals and may include: a first transistor configured to receive the first input signal at its gate; a second transistor having its gate biased, its source electrically connected to a first potential, and its drain electrically connected to a drain of the first transistor; a third transistor having its gate electrically connected to the drain of the first transistor and its source electrically connected to a second potential; a fourth transistor having its gate electrically connected to the drain of the first transistor and its source electrically connected to the second potential; a fifth transistor having its gate biased, its source electrically connected to a drain of the third transistor, and its drain electrically connected to a source of the first transistor; a sixth transistor having its gate biased, its source electrically connected to a drain of the fourth transistor, and its drain electrically connected to a second output terminal configured to output the second output signal; a first resistive element, one terminal of which is electrically connected to the first potential and the other terminal of which is electrically connected to the second output terminal; a seventh transistor configured to receive the second input signal at its gate; an eighth transistor having its gate biased, its source electrically connected to the first potential, and its drain electrically connected to a drain of the seventh transistor; a ninth transistor having its gate electrically connected to the drain of the seventh transistor and its source electrically connected to the second potential; a tenth transistor having its gate electrically connected to the drain of the seventh transistor and its source electrically connected to the second potential; an eleventh transistor having its gate biased, its source electrically connected to a drain of the ninth transistor, and its drain electrically connected to a source of the seventh transistor; a twelfth transistor having its gate biased, its source electrically connected to a drain of the tenth transistor, and its drain electrically connected to a first output terminal configured to output the first output signal; a second resistive element, one terminal of which is electrically connected to the first potential and the other terminal of which is electrically connected to the first output terminal; and a third resistive element electrically connected to the source of the first transistor and the source of the seventh transistor.

Yet alternatively, a fourth low noise amplifier according to the present disclosure receives first and second input signals and outputs first and second output signals and may include: a first transistor configured to receive the first input signal at its gate; a second transistor having its gate biased, its source electrically connected to a first potential, and its drain electrically connected to a drain of the first transistor; a third transistor having its gate biased and its source electrically connected to the drain of the first transistor; a fourth transistor having its gate biased, its source electrically connected to a second potential, and its drain electrically connected to a drain of the third transistor; a fifth transistor having its gate electrically connected to the drain of the fourth transistor, its source electrically connected to a second output terminal configured to output the second output signal, and its drain electrically connected to a source of the first transistor; a first resistive element, one terminal of which is electrically connected to the second potential and the other terminal of which is electrically connected to the second output terminal; a sixth transistor configured to receive the second input signal at its gate; a seventh transistor having its gate biased, its source electrically connected to the first potential, and its drain electrically connected to a drain of the sixth transistor; an eighth transistor having its gate biased and its source electrically connected to the drain of the sixth transistor; a ninth transistor having its gate biased, its source electrically connected to the second potential, and its drain electrically connected to a drain of the eighth transistor; a tenth transistor having its gate electrically connected to the drain of the ninth transistor, its source electrically connected to a first output terminal configured to output the first output signal, and its drain electrically connected to a source of the sixth transistor; a second resistive element, one terminal of which is electrically connected to the second potential and the other terminal of which is electrically connected to the first output terminal; and a third resistive element electrically connected to the source of the first transistor and the source of the sixth transistor.

The second to fourth low noise amplifiers may also achieve the same or similar advantages as/to the first low noise amplifier.

The present disclosure may provide a low noise amplifier capable of operating at an even lower power while maintaining good noise and distortion characteristics.

DETAILED DESCRIPTION

Figure 1:
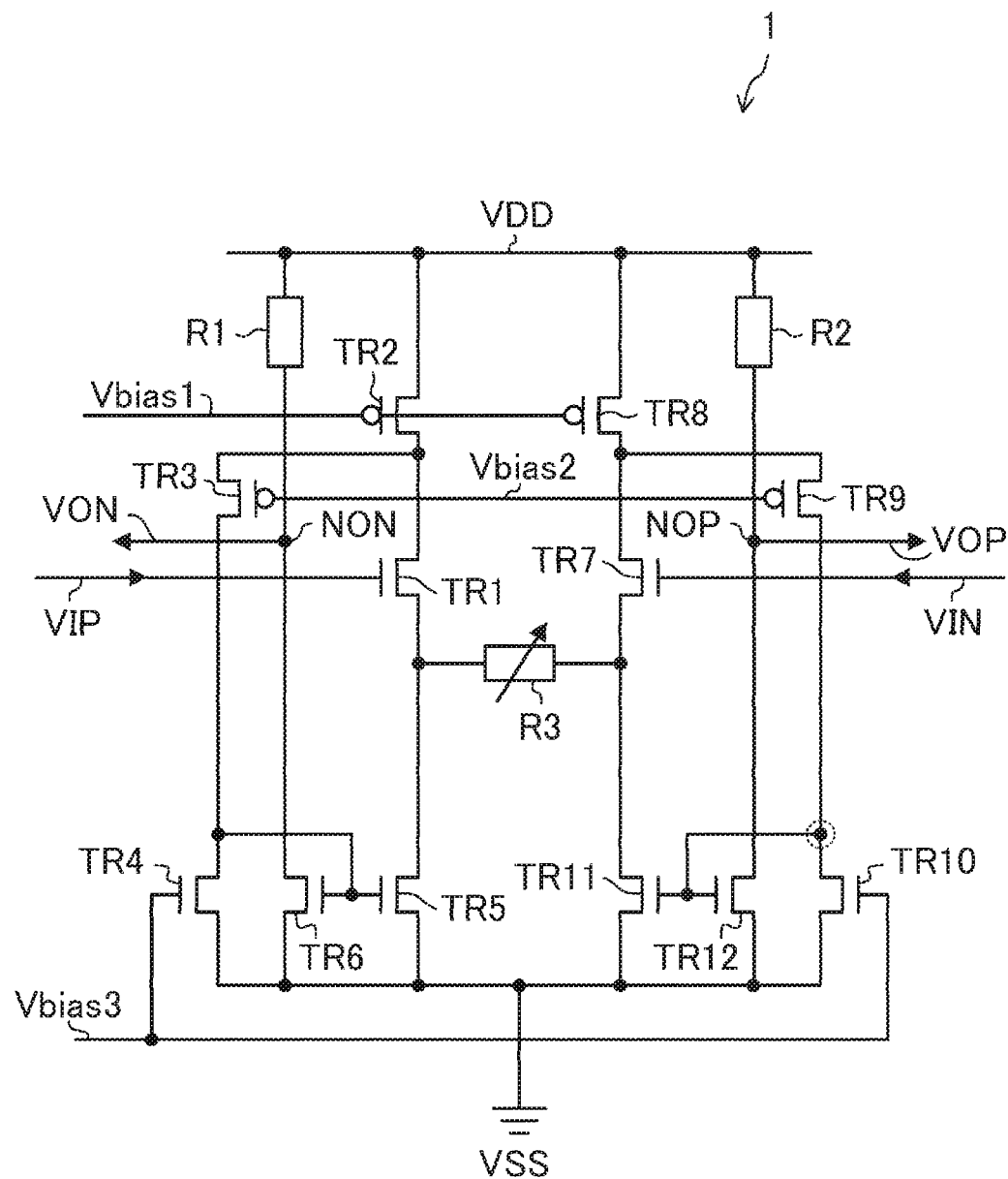
FIG. 1 is a circuit diagram showing a configuration of a low noise amplifier according to a first embodiment.

Embodiments of the present disclosure will now be described in detail with reference to the accompanying drawings. In each of the embodiments, two or more circuit components that are electrically connected together will be hereinafter simply referred to as circuit components "connected" together. That is to say, the term "connecting" or "connection" in each of the embodiments indicates not only directly connecting circuit components together but also indirectly connecting them together such that a signal may be transmitted via elements such as a capacitive element and a transistor.

Also, in the following embodiments and variations, unless otherwise specified, the same reference character indicates the same component.

First Embodiment

FIG. 1 is a circuit diagram showing a configuration of a low noise amplifier according to a first embodiment. The low noise amplifier according to this embodiment has a differential configuration, and amplifies the differential voltage between first and second input signals VIP and VIN, and outputs first and second output signals VOP and VON.

A low noise amplifier 1 includes an n-channel transistor TR1 functioning as a first transistor, a p-channel transistor TR2 functioning as a second transistor, a p-channel transistor TR3 functioning as a third transistor, an n-channel transistor TR4 functioning as a fourth transistor, an n-channel transistor TR5 functioning as a fifth transistor, an n-channel transistor TR6 functioning as a sixth transistor, an n-channel transistor TR7 functioning as a seventh transistor, a p-channel transistor TR8 functioning as an eighth transistor, a p-channel transistor TR9 functioning as a ninth transistor, an n-channel transistor TR10 functioning as a tenth transistor, an n-channel transistor TR11 functioning as an eleventh transistor, an n-channel transistor TR12 functioning as a twelfth transistor, a resistive element R1 functioning as a first resistive element, a resistive element R2 functioning as a second resistive element, and a resistive element R3 functioning as a third resistive element.

The transistors TR1-TR12 and the resistive elements R1-R3 are connected between, e.g., a power supply potential VDD used as a first potential and, e.g., a ground potential VSS used as a second potential lower than the first potential.

Specifically, the transistor TR1 receives, at its gate, a voltage VIP as a first input signal. Also, the transistor TR1 has its source connected to one terminal of the resistive element R3 and the drain of the transistor TR5, and has its drain connected to the drain of the transistor TR2 and the source of the transistor TR3.

The transistor TR2 receives a bias potential $V_{bias1}$ at its gate. Also, the transistor TR2 has its source connected to the power supply potential VDD, and its drain connected to the source of the transistor TR3.

The transistor TR3 receives a bias potential $V_{bias2}$ at its gate. Also, the transistor TR3 has its drain connected to the drain of the transistor TR4, the gate of the transistor TR5, and the gate of the transistor TR6.

The transistor TR4 receives a bias potential $V_{bias3}$ at its gate. Also, the transistor TR4 has its source connected to the ground potential VSS.

The transistor TR5 has its gate connected to the gate of the transistor TR6, its source connected to the ground potential VSS, and its drain connected to one terminal of the resistive element R3.

The transistor TR6 has its drain connected to a node NON functioning as a second output terminal, and its source connected to the ground potential VSS. The node NON outputs a voltage VON as a second output signal.

The resistive element R1 is connected between the node NON and the power supply potential VDD.

The transistor TR7 receives, at its gate, a voltage VIN as a second input signal. Also, the transistor TR7 has its source connected to the other terminal of the resistive element R3 and the drain of the transistor TR11, and has its drain connected to the drain of the transistor TR8 and the source of the transistor TR9.

The transistor TR8 receives a bias potential $V_{bias1}$ at its gate. Also, the transistor TR8 has its source connected to the power supply potential VDD, and its drain connected to the source of the transistor TR9.

The transistor TR9 receives a bias potential $V_{bias2}$ at its gate. Also, the transistor TR9 has its drain connected to the drain of the transistor TR10, the gate of the transistor TR11, the gate of the transistor TR12.

The transistor TR10 receives a bias potential $V_{bias3}$ at its gate. Also, the transistor TR10 has its source connected to the ground potential VSS.

The transistor TR11 has its gate connected to the gate of the transistor TR12, its source connected to the ground potential VSS, and its drain connected to the other terminal of the resistive element R3.

The transistor TR12 has its drain connected to a node NOP functioning as a first output terminal, and its source connected to the ground potential VSS. The node NOP outputs a voltage VOP as a first output signal.

The resistive element R2 is connected between the node NOP and the power supply potential VDD.

The resistive element R3 has a variable resistance value, and is connected to the source of the transistor TR1 and the source of the transistor TR7.

The resistance value of the resistive element R3 may be a fixed one. Also, in order to reduce the noise caused by the transistors TR2 and TR8 which function as current sources, a resistive element may be connected between the power supply potential VDD and each of the sources of the transistors TR2 and TR8.

Next, it will be described how the low noise amplifier 1 according to this embodiment operates. Here, supposing that the first and second input signals have the same voltage, i.e., VIP=VIN, there is no voltage difference between both terminals of the resistive element R3, and no current flows through the resistive element R3. A drain current I1 of the transistor TR1 is the difference between a current value I2 of a constant current source configured as the transistor TR2 and a current value I4 of the constant current source configured as the transistor TR4, i.e., I2−I4. Thus, this current I1=I2−I4 is injected into the drain of the transistor TR5. The gate voltage of the transistor TR5 is determined by a feedback circuit comprised of the transistors TR1-TR5 such that the drain current of the transistor TR5 agrees with the drain current I1.

Here, suppose that the channel width and channel length of the transistor TR6 are W6 and L6, the channel width and channel length of the transistor TR5 are W5 and L5, and their size ratio is expressed by K1=(W6/L6)/(W5/L5). In this case, the drain current I1 also flows through the transistor TR6 in a mirror pattern as to satisfy the expression I6=K1×I1, and flows into the resistive element R1. Thus, a voltage of the second output terminal is given by the following expression:

$$VON = V_{val} - R_o \times K1 \times I1$$

where $V_{val}$ is the potential value of the power supply potential VDD, and $R_o$ is the resistance value of the resistive element R1.

Likewise, the drain current I7 of the transistor TR7 is the difference between a current value I8 of the constant current source configured as the transistor TR8 and a current value I10 of the constant current source configured as the transistor TR10, i.e., I8−I10. Thus, this current I7=I8−I10 is injected as it is into the drain of the transistor TR11. The gate voltage of the transistor TR11 is determined by a feedback circuit comprised of the transistors TR7-TR11 such that the drain current of the transistor TR11 agrees with the drain current I7.

Here, suppose that the channel width and channel length of the transistor TR12 are W12 and L12, the channel width and channel length of the transistor TR11 are W11 and L11, and their size ratio is expressed by K2=(W12/L12)/(W11/L11). In this case, the drain current I7 also flows through the transistor TR12 in a mirror pattern as to satisfy the expression I12=K2×I7, and flows into the resistive element R2. Thus, a voltage of the first output terminal is given by the following expression:

$$VOP = V_{val} - R_o \times K2 \times I7$$

where $R_o$ is the resistance value of the resistive element R2 which is equal to R1

Thus, if the values are set such that I2=I8 and I4=I10, i.e., I1=I7 and K1=K2=K are satisfied, VON is equal to VOP, and an output differential voltage is zero.

Next, if, e.g., as the first and second input signals, voltages, of which the differential voltage is expressed by VIP−VIN=ΔV>0, are applied, the differential voltage ΔV is applied to both terminals of the resistive element R3. Thus, a current of IR3=ΔV/$R_i$ where $R_i$ is the resistance value of the resistive element R3 flows into the resistive element R3 in a direction leading from the transistor TR1 toward the transistor TR7. At this time, the current injected into the drain of the transistor TR5 decreases to I1−IR3. However, a change in gate voltage of the transistor TR5 compensates for this decrease in the current injected into the drain of the transistor TR5. Specifically, the gate voltage of the transistor TR5 is changed by a feedback circuit comprised of the transistors TR1-TR5 such that the drain current of the transistor TR5 agrees with the current of I1−IR3. This current I1−IR3 also flows through the transistor TR6 in a mirror pattern so as to satisfy the expression I6=K1 (I1−IR3), and flows into the resistive element R1. Thus, the voltage of the second output terminal is given by the following expression:

$$VON = V_{val} - R_o \times K1(I1 - IR3)$$

On the other hand, the current injected into the drain of the transistor TR11 increases to I7+IR3. The gate voltage of the transistor TR11 is changed by a feedback circuit comprised of the transistors TR7-TR11 such that the drain current of the transistor TR11 agrees with the current I7+IR3, and the increase in the current is compensated by the change of the gate voltage. This current I7+IR3 also flows through the transistor TR12 in a mirror pattern so as to satisfy the expression I12=K2 (I7+IR3), and flows into the resistive element R2. Thus, the voltage of the first output terminal is given by the following expression:

$$VOP = V_{val} - R_o \times K2(I7 + IR3)$$

Thus, if the values are set such that I2=I8 and I4=I10 are satisfied, i.e., I1=I7 and K1=K2=K, the differential voltage between the two output terminals is given by the following expression:

$$VON - VOP = 2R_o \times K \times IR3$$

If ΔV/R_i is substituted for IR3, the differential voltage is given by the following expression:

$$VON-VOP=2R_o \times K \times \Delta V/R_i$$

Consequently, the gain is calculated by the following expression:

$$(VON-VOP)/\Delta V = 2R_o \times K/R_i$$

That is to say, the gain is determined by only the resistance ratio and the size ratio of the transistors.

As can be seen, according to the present disclosure, the drain currents of a pair of differential input transistors TR1 and TR7 are always kept constant regardless of the current flowing through the resistive element R3, and the differential voltage between the input signals is exactly transmitted to both terminals of the resistive element R3. Thus, the gain is determined exactly by only the resistance ratio and the size ratio of the transistors. That is to say, the gain may be obtained with high precision and low distortion. Besides, the configuration shown in FIG. 1 may allow the low noise amplifier 1 to operate at a low voltage. This may achieve further reduction in power consumption. This advantage will now be described in comparison with an example of the known art.

Figure 2:
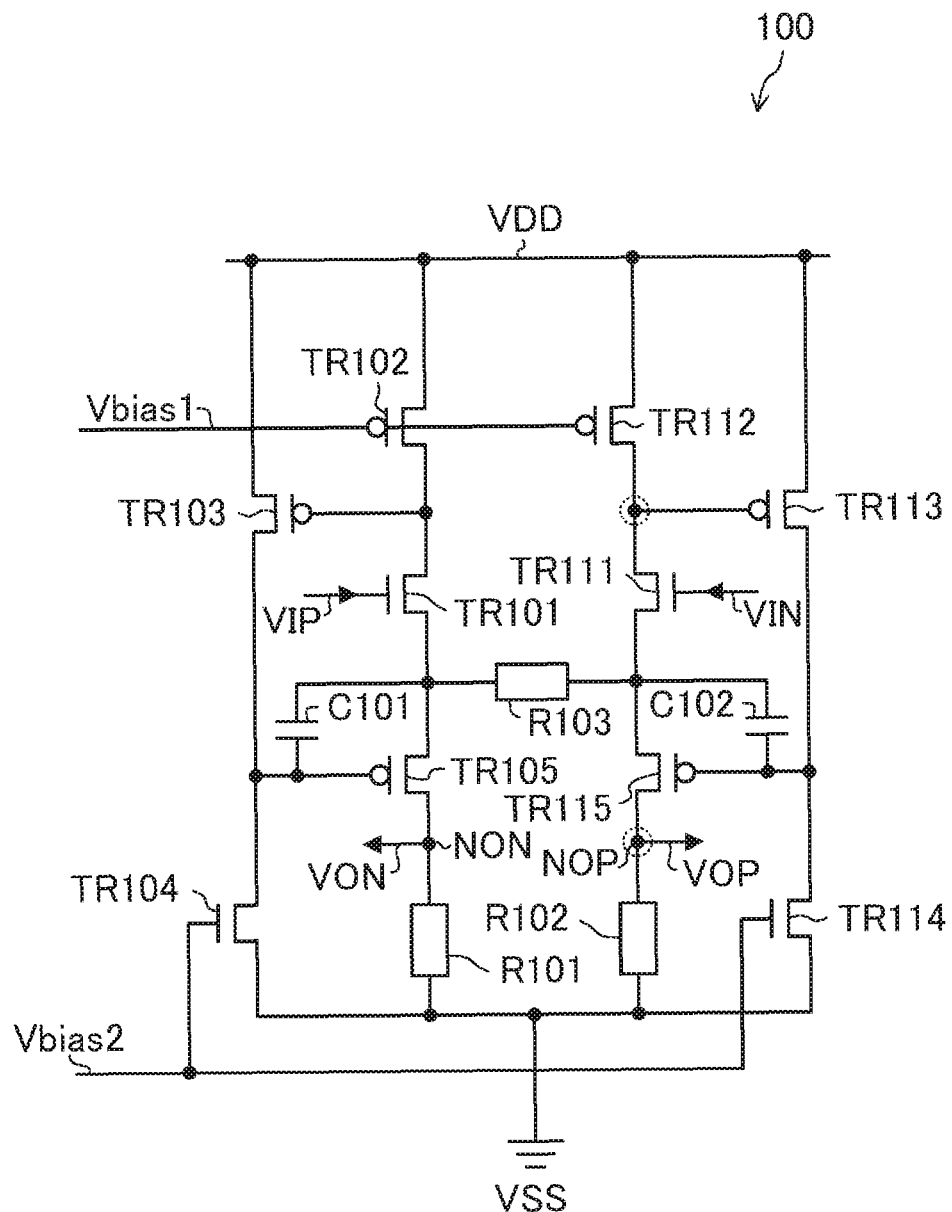
FIG. 2 is a circuit diagram showing a configuration of a low noise amplifier according to a comparative example for the amplifier shown in FIG. 1.

FIG. 2 illustrates a circuit configuration for a low noise amplifier as a comparative example for the amplifier shown in FIG. 1. The circuit shown in FIG. 2 of the present application is an equivalent circuit shown in FIG. 5 of U.S. Pat. No. 6,118,340.

This conventional low noise amplifier 100 includes n-channel transistors TR101, TR104, TR111, and TR114, p-channel transistors TR102, TR103, TR105, TR112, TR113, and TR115, resistive elements R101-R103, and capacitive elements C101 and C102. These components are connected between a power supply potential VDD and a ground potential VSS, as shown in FIG. 2.

The transistor TR101 receives a voltage VIP at its gate, and the transistor TR111 receives a voltage VIN at its gate. The node NON outputs a voltage VON, and the node NOP outputs a voltage VOP.

The relation between the operating voltage of the low noise amplifier 100 having such a differential configuration and an input dynamic range thereof will now be described.

In FIG. 2, suppose that the power supply potential VDD has a value $V_{val}$, the n-channel transistors TR101 and TR111 each have a gate-source voltage $V_{gn}$, the p-channel transistors TR103 and TR113 each have a gate-source voltage $V_{gp}$, the n-channel transistors TR101 and TR111 each have a drain-source voltage $V_{dsn}$, the p-channel transistor TR105 and TR115 each have a drain-source voltage $V_{dsp}$, the voltages VOP and VON each have an amplitude $V_{oa}$, and an output common voltage is $V_{oc}$.

In this case, the upper limit $V_{iH}$ and the lower limit $V_{iL}$ of the input dynamic range in FIG. 2 may be given by the following expressions:

$$V_{iH}=V_{val}-V_{gp}+V_{gn}-V_{dsn} \quad \text{Expression (1)}$$

$$V_{iL}=V_{oc}+V_{oa}+V_{gn}+V_{dsp} \quad \text{Expression (2)}$$

Here, suppose that, for example, $V_{val}$ is 3.3 V, $V_{gp}$ is 0.5 V, $V_{gn}$ is 0.5 V, $V_{dsn}$ is 0.2 V, $V_{dsp}$ is 0.2 V, $V_{oc}$ is 0.5 V, and $V_{oa}$ is 0.6335/2V, i.e., the peak value of the output signal is 0.6335 V.

If these values are substituted into the Expressions (1) and (2), $V_{iH}$ and $V_{iL}$ become as follows:

$$V_{iH}=3.3-0.5+0.5-0.2=3.1 \text{ V}$$

$$V_{iL}=0.5+0.6335/2+0.5+0.2=1.5 \text{ V}$$

That is to say, the input dynamic range is from 1.5 V to 3.1 V, i.e., the magnitude of the input dynamic range is 1.6 V. Even if the peak value of the input signal is supposed to be 0.5 V, the dynamic range is broad enough to allow the amplifier to operate normally.

As can be seen, the conventional low noise amplifier 100 may operate normally when its operating voltage is relatively high. Next, it will be described based on the numerical values provided above whether or not the operating voltage may be reduced to further reduce the power consumption of the low noise amplifier.

Specifically, if, e.g., $V_{val}$ is 1.8 V in the low noise amplifier 100, $V_{iH}$ and $V_{iL}$ are calculated by Expressions (1) and (2):

$$V_{iH}=1.8-0.5+0.5-0.2=1.6 \text{ V}$$

$$V_{iL}=0.32+0.6335/2+0.5+0.2=1.34 \text{ V}$$

where $V_{oc}$ is 0.32 V and other values are the same as described above.

As can be seen, if the operating voltage of the low noise amplifier 100 is 1.8 V, the input dynamic range is from 1.34 V to 1.6 V, i.e., the magnitude of the input dynamic range is 0.26 V. If the peak of the input signal wave is 0.5 V, then the dynamic range is not broad enough to allow the amplifier to operate normally.

That is to say, in the low noise amplifier 100, the circuit comprised of TR101, TR102, TR111, TR112, and R103 and receiving input signals, and the circuit comprised of TR105, R101, TR115, and R102 and outputting output signals form a cascade amplifier. Thus, the input and output dynamic ranges become too narrow to further reduce the power consumption easily by lowering the operating voltage. That may be understood easily since Expression (2) indicating the lower limit $V_{iL}$ of the input dynamic range includes the term $V_{oc}+V_{oa}$ that indicates the maximum value of the output dynamic range, and wider input and output dynamic ranges are not simultaneously obtained.

In contrast, in the low noise amplifier 1 according to this embodiment, as shown in FIG. 1, the circuit comprised of TR1, TR2, TR5, TR7, TR8, TR11 and R3 and receiving input signals, and the circuit comprised of TR6, R1, TR12, and R2 and outputting output signals are arranged in parallel with each other. Thus, the input and output dynamic ranges may be broad enough to further reduce the power consumption by lowering the operating voltage.

Specifically, in the low noise amplifier 1, suppose that the power supply potential VDD has a value $V_{val}$, the n-channel transistors TR1 and TR7 each have a gate-source voltage $V_{gn}$, the p-channel transistors TR2 and TR8 each have a drain-source voltage $V_{dsp}$, and the n-channel transistors TR1, TR5, TR6, TR7, TR11, and TR12 each have a drain-source voltage $V_{dsn}$. In this case, the upper limit $V_{iH}$ and the lower limit $V_{iL}$ of the input dynamic range in FIG. 1 may be given by the following expressions:

$$V_{iH}=V_{val}-V_{dsp}+V_{gn}-V_{dsn} \quad \text{Expression (3)}$$

$$V_{iL}=V_{gn}+V_{dsn} \quad \text{Expression (4)}$$

Here, suppose that $V_{val}$ is 1.8 V, $V_{dsp}$ is 0.2 V, $V_{gn}$ is 0.5 V, and $V_{dsn}$ is 0.2 V, for example. If other conditions are the same as described above and these values are substituted into the Expressions (3) and (4), then $V_{iH}$ and $V_{iL}$ are given by the following expressions:

$$V_{iH} = 1.8 - 0.2 + 0.5 - 0.2 = 1.9 \text{ V}$$

$$V_{iL} = 0.5 + 0.2 = 0.7 \text{ V}$$

That is to say, it can be seen that the input dynamic range is from 0.7 V to 1.9 V, i.e., the magnitude of the input dynamic range is 1.2 V, which is significantly broader than the input dynamic range of 0.26 V in the conventional circuit in FIG. 2. It can also be seen that even if the peak value of the input signal is supposed to be 0.5 V, the amplifier may still operate normally with a sufficient margin. Furthermore, neither Expression (3) nor Expression (4) has the term $V_{oc}+V_{oa}$. This means that the input dynamic range may be set independently of the output dynamic range. On the other hand, the upper limit $V_{oH}$ and the lower limit $V_{oL}$ of the output dynamic range may be given by the following expressions:

$$V_{oH} = V_{val} \quad \text{Expression (5)}$$

$$V_{iL} = V_{dsn} \quad \text{Expression (6)}$$

That is to say, an output dynamic range of 1.6 V may be obtained at maximum. As can be seen, even if operating at a supply voltage lower than the lower limit operating voltage of the conventional low noise amplifier 100, the low noise amplifier 1 may still have sufficiently broad input and output dynamic ranges. This enables further reduction in power consumption by lowering the operating voltage.

In addition, the low noise amplifier 1 shown in FIG. 1 requires a smaller circuit area than the lower noise amplifier 100 shown in FIG. 2 does.

Specifically, the dotted circles in FIGS. 1 and 2 indicate circuit poles.

If there are two poles as shown in FIG. 2, the phase rotates 180 degrees, and thus, phase compensation is required. For example, capacitive elements C101 and C102 are required. U.S. Pat. No. 6,118,340 does not show such capacitive elements in FIG. 5. However, in order to actually operate the amplifier shown in FIG. 5 of U.S. Pat. No. 6,118,340, the amplifier needs such capacitive elements for phase compensation.

In contrast, there is one pole in the low noise amplifier 1 shown in FIG. 1, and thus, the capacitive elements for phase compensation may be omitted. Those capacitive elements account for a relatively large percentage of the total circuit area. Thus, the low noise amplifier 1 requiring no capacitive elements may have a significantly reduced circuit area. If the low noise amplifier 1 has as large a circuit area as the low noise amplifier 100, the low noise amplifier 1 with no capacitive elements may use transistors of an increased size within the same circuit area. Thus, the low noise amplifier 1 may have further improved noise characteristics.

Optionally, the low noise amplifier 1 may include a capacitive element for phase compensation. Even so, the size of the capacitive elements is smaller than, and may be about one tenth of, that of the capacitive elements C101 and C102 used for the low noise amplifier 100.

Figure 16:
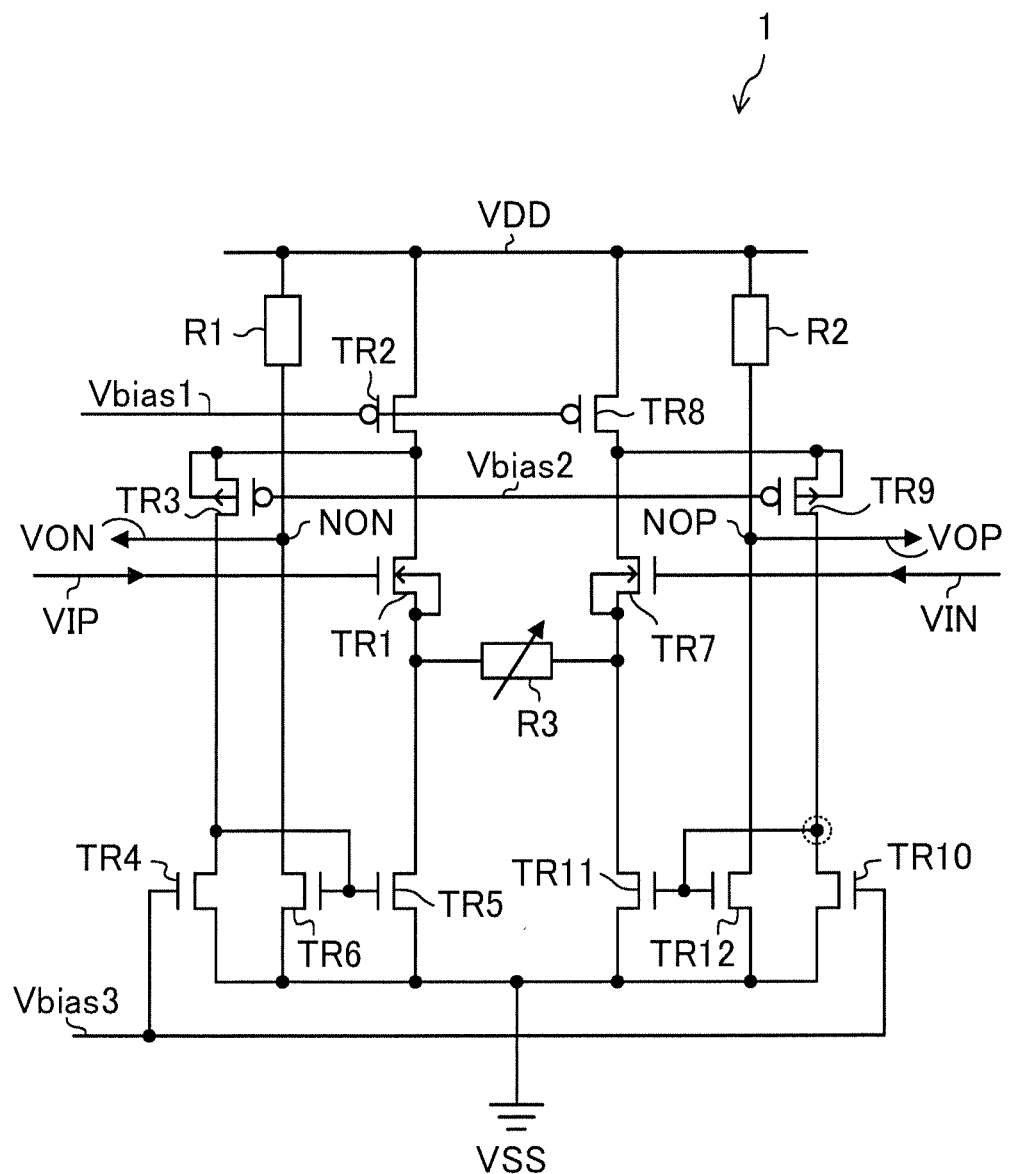
FIG. 16 is a circuit diagram showing another configuration of a low noise amplifier according to a first embodiment.

In this embodiment, in at least one of a pair of the transistors TR1 and TR7 or a pair of the transistors TR3 and TR9, their backgates and sources may be connected together. See, FIG. 16.

—First Variation—

Figure 3:
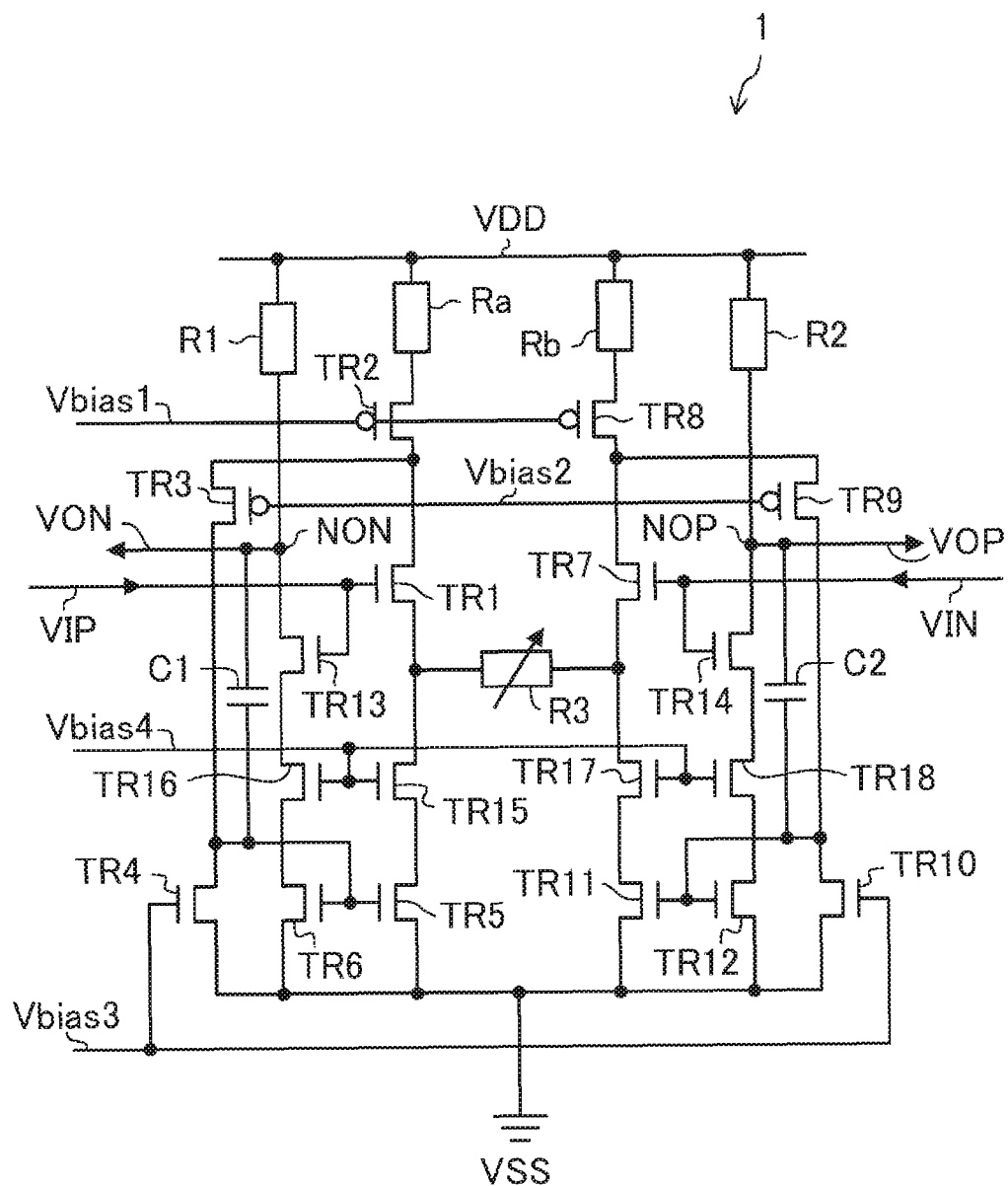
FIG. 3 is a circuit diagram showing a configuration of a low noise amplifier according to a first variation of the first embodiment.

FIG. 3 is a circuit diagram showing a configuration of a low noise amplifier according to a first variation. The following description of this variation will be focused on the difference between this variation and the embodiment shown in FIG. 1.

A low noise amplifier 1 shown in FIG. 3 includes, in addition to every one of the components shown in FIG. 1, resistive elements Ra and Rb, n-channel transistors TR13 and TR14 functioning as thirteenth and fourteenth transistors, n-channel transistors TR15 and TR16 functioning as fifteenth and sixteenth transistors, n-channel transistors TR17 and TR18 functioning as seventeenth and eighteenth transistors, and capacitive elements C1 and C2.

The resistive element Ra is connected between the source of the transistor TR2 and the power supply potential VDD. The resistive element Rb is connected between the source of the transistor TR8 and the power supply potential VDD. The resistive elements Ra and Rb are provided to reduce the noise caused by the transistors TR2 and TR8 each functioning as a current source.

The transistor TR13 has its gate connected to the gate of the transistor TR1, and receives a voltage VIP at its gate. The transistor TR13 has its source connected to the drain of the transistor TR16, and its drain connected to the node NON.

The transistors TR15 and TR16 are provided as a pair, and are cascaded to the transistors TR5 and TR6, respectively.

Specifically, the transistor TR15 receives a bias potential $V_{bias4}$ at its gate. The transistor TR15 has its source connected to the drain of the transistor TR5, and has its drain connected to the source of the transistor TR1 and the resistive element R3.

The transistor TR16 receives the bias potential $V_{bias4}$ at its gate. The transistor TR16 has its source connected to the drain of the transistor TR6, and its drain connected to the source of the transistor TR13.

Optionally, multiple pairs of transistors TR15 and TR16 may be cascaded to the transistors TR5 and TR6.

Specifically, a plurality of transistors TR15 may be cascaded together between the source of the transistor TR1 and the drain of the transistor TR5. A plurality of transistors TR16 may be cascaded together between the source of the transistor TR13 and the drain of the transistor TR6.

The capacitive element C1 has one terminal connected to the node NON, and the other terminal connected to the drain of the transistor TR4, the gate of the transistor TR5, and the gate of the transistor TR6.

The transistor TR14 has its gate connected to the gate of the transistor TR7, and receives the voltage VIN at its gate. The transistor TR14 has its source connected to the drain of the transistor TR18, and its drain connected to the node NOP.

The transistors TR17 and TR18 are provided as a pair, and are cascaded to the transistors TR11 and TR12, respectively.

Specifically, the transistor TR17 receives the bias potential $V_{bias4}$ at its gate. The transistor TR17 has its source connected to the drain of the transistor TR11, and has its drain connected to the source of the transistor TR7 and the resistive element R3.

The transistor TR18 receives the bias potential $V_{bias4}$ at its gate. The transistor TR18 has its source connected to the drain of the transistor TR12, and has its drain connected to the source of the transistor TR14.

Optionally, multiple pairs of transistors TR17 and TR18 may be cascaded to the transistors TR11 and TR12.

That is to say, a plurality of transistors TR17 may be cascaded together between the source of the transistor TR7 and the drain of the transistor TR11. A plurality of transistors TR18 may be cascaded together between the source of the transistor TR14 and the drain of the transistor TR12.

The capacitive element C2 has one terminal connected to the node NOP, and the other terminal connected to the drain of the transistor TR10, the gate of the transistor TR11, and the gate of the transistor TR12.

The capacitive elements C1 and C2 are provided for the purpose of phase compensation described above.

As can be seen, the low noise amplifier 1 according to this variation may have further improved distortion characteristics.

Specifically, low current mirror accuracy between the transistors TR5 and TR6 and between the transistors TR11 and TR12 may deteriorate the distortion characteristics of the low noise amplifier 1.

Therefore, in this variation, the transistor TR15 is cascaded to the drain of the transistor TR5 functioning as a current source, and the transistor TR16 is cascaded to the drain of the transistors TR6 functioning as a current source. This thus hardly causes a potential difference between the respective drains of the transistors TR5 and TR6, and allows the potentials at the drains of these transistors TR5 and TR6 to be substantially equal to each other. As a result, the current mirror accuracy may be kept high.

Furthermore, providing the transistor TR13 configured to receive the voltage VIP at its gate and functioning as a source follower brings the respective drain potentials of the transistors TR15 and TR16 close to each other. This may further improve the current mirror accuracy.

The transistors TR14, TR17, and TR18 also have the same or similar configuration as/to the transistors TR13, TR15, and TR16, respectively.

Not both of the pair of transistors TR13 and TR14 and the group of the transistors TR15-TR18 are always needed. Only the pair of transistors TR13 and TR14 or the group of the transistors TR15-TR18 may be provided.

That is to say, the pair of the transistors TR15 and TR16 and the pair of the transistors TR17 and TR18 may be both omitted. In this case, the transistor TR13 may be connected anywhere between the node NON and the drain of the transistor TR6, and the transistor TR14 may be connected anywhere between the node NOP and the drain of the transistor TR12.

If the pair of the transistors TR13 and TR14 is omitted, the transistor TR15 may be connected between the transistors TR1 and TR5, the transistor TR16 may be connected between the node NON and the transistor TR6, the transistor TR17 may be connected between the transistors TR7 and TR11, and the transistor TR18 may be connected between the node NOP and the transistor TR12.

Figure 17:
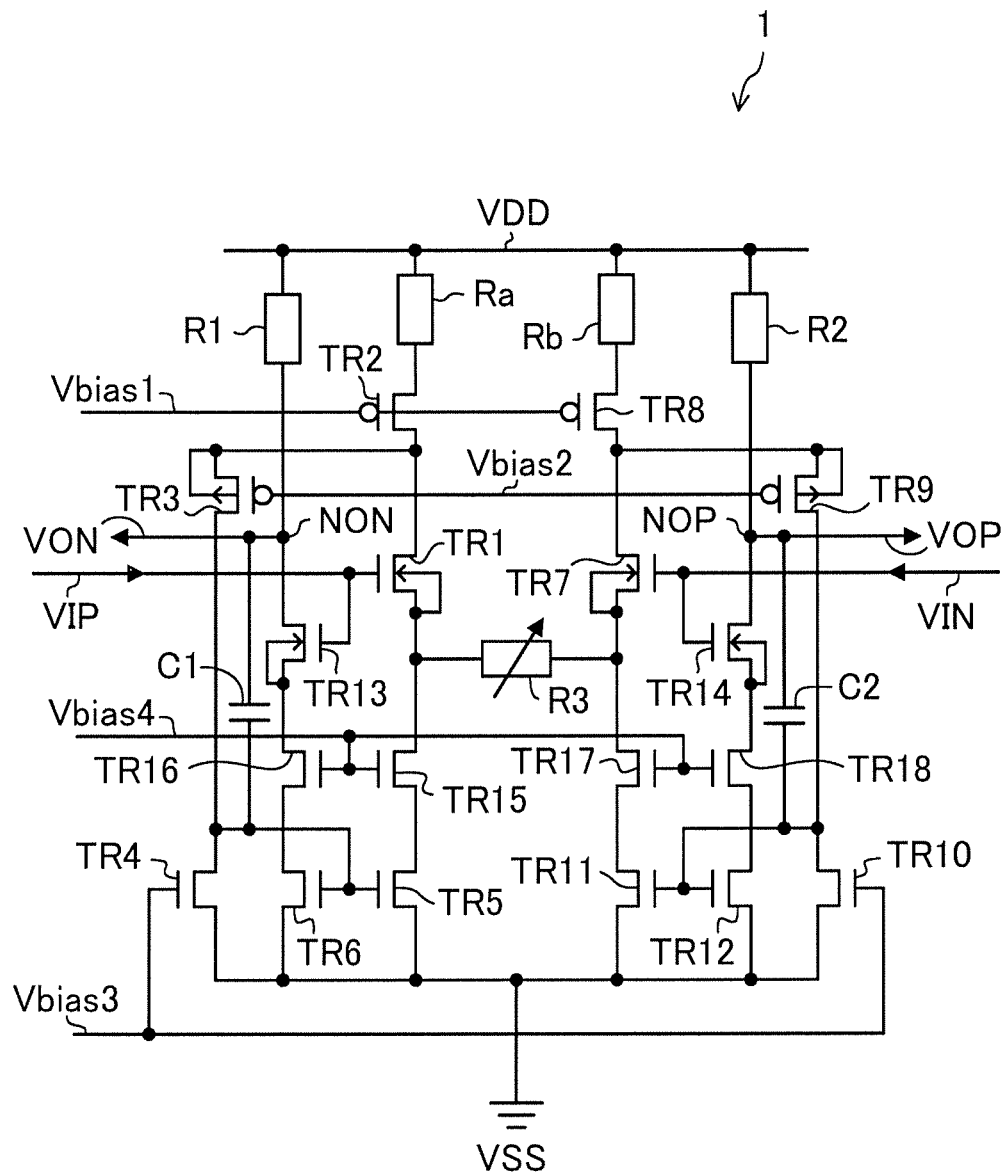
FIG. 17 is a circuit diagram showing another configuration of a low noise amplifier according to a first variation of the first embodiment.

Also, in this variation, the backgates and sources of the transistors TR1, TR7, TR13, and TR14 may be connected together. The backgates and sources of the transistors TR3 and TR9 may be connected together. Furthermore, the backgates and sources of the transistors TR1, TR3, TR7, TR9, TR13, and TR14 may be connected together. See, FIG. 17.

—Second Variation—

Figure 4:
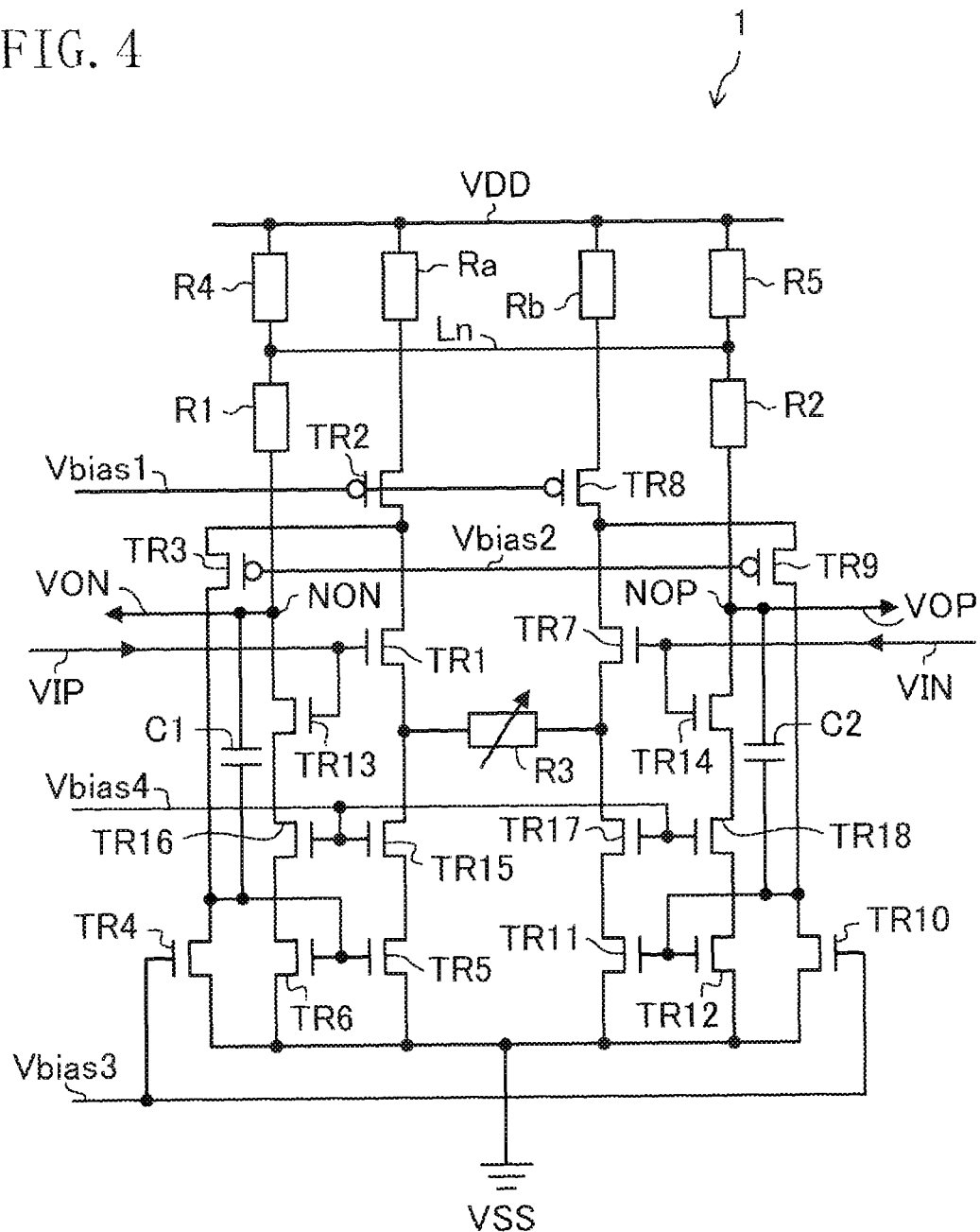
FIG. 4 is a circuit diagram showing a configuration of a low noise amplifier according to a second variation of the first embodiment.

FIG. 4 is a circuit diagram showing a configuration of a low noise amplifier according to a second variation. The following description of this variation will be focused on the difference between this variation and the variation shown in FIG. 3.

In the low noise amplifier 1 according to this variation, a resistive element R4 functioning as a fourth resistive element is provided between the resistive element R1 and the power supply potential VDD, a resistive element R5 functioning as a fifth resistive element is provided between the resistive element R2 and the power supply potential VDD, and a connection node between the resistive elements R1 and R4 is connected to a connection node between the resistive elements R2 and R5 through a line Ln.

The current flowing through the transistor TR6, i.e., the current flowing through the resistive element R1 is K1 (I1−IR3), and the current flowing through the transistor TR12, i.e., the current flowing through the resistive element R2 is K2 (I7+IR3), as described above. Thus, its total current is always constant, i.e., is given by the expression 2K×I1 (where K1=K2=K, I1=I7). If the resistive elements R4 and R5 are supposed to have a resistance value of Rc, the output voltage range is shifted by Rc×K×I1.

As can be seen, according to this configuration, changing the resistance value Rc may easily allow the output range to vary. Thus, optimizing the resistance value Rc such that the output range agrees with an input range of a circuit on a next circuit may easily allow the amplifier 1 to be directly coupled to the next circuit, and the capacitive elements for capacitive coupling may be omitted. Note that only one of the resistive elements R4 or R5 may be provided. The magnitude of level shift in this case is 2Rc×K×I1.

—Third Variation—

Figure 5:
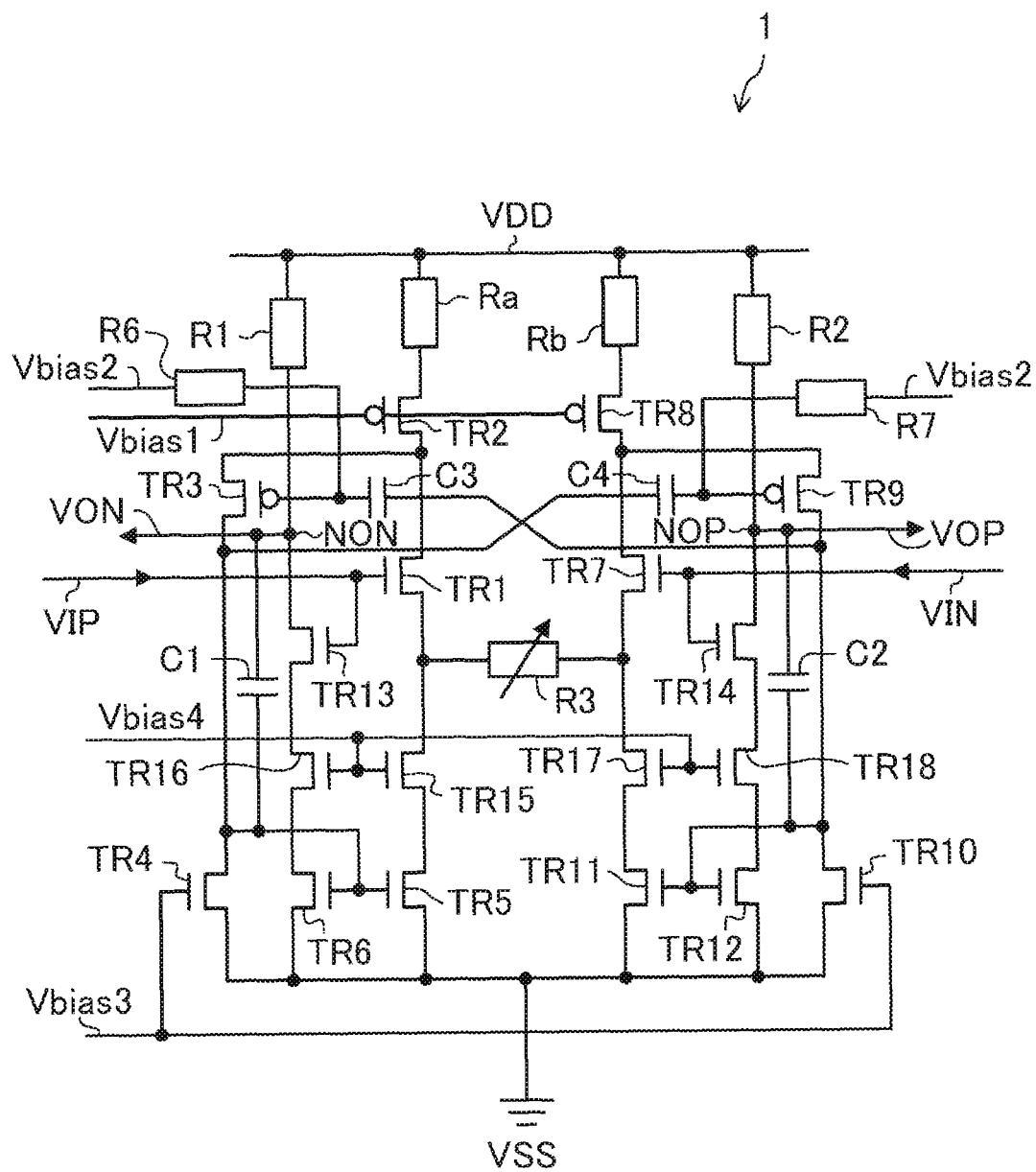
FIG. 5 is a circuit diagram showing a configuration of a low noise amplifier according to a third variation of the first embodiment.

FIG. 5 is a circuit diagram showing a configuration of a low noise amplifier according to a third variation. The following description of this variation will be focused on the difference between this variation and the variation shown in FIG. 3.

The low noise amplifier 1 according to this variation includes capacitive elements C3 and C4, and resistive elements R6 and R7.

The transistor TR3 receives the bias potential $V_{bias2}$ at its gate via the resistive element R6, and has its gate connected to the drain of the transistor TR9 via the capacitive element C3.

The transistor TR9 receives the bias potential $V_{bias2}$ at its gate via the resistive element R7, and has its gate connected to the drain of the transistor TR3 via the capacitive element C4.

As can be seen, according to the low noise amplifier 1 of this variation, suppose that, e.g., a dispersion in performance between devices of respective lots causes a difference between the signal amplitude at the drain of the transistor TR3 and the signal amplitude at the drain of the transistor TR9, and thereby causes an amplitude error between the differential outputs VOP and VON. Even so, the low noise amplifier 1 operates so as to reduce the difference between the signal amplitudes and to improve the symmetry of the circuit since a gain boost is weakly applied to the transistor having the larger signal amplitude at its drain, and the gain boost is strongly applied to the transistor having the smaller signal amplitude at its drain. As a result, distortion characteristics such as a second-order distortion, in particular, may be improved.

—Fourth Variation—

Figure 6:
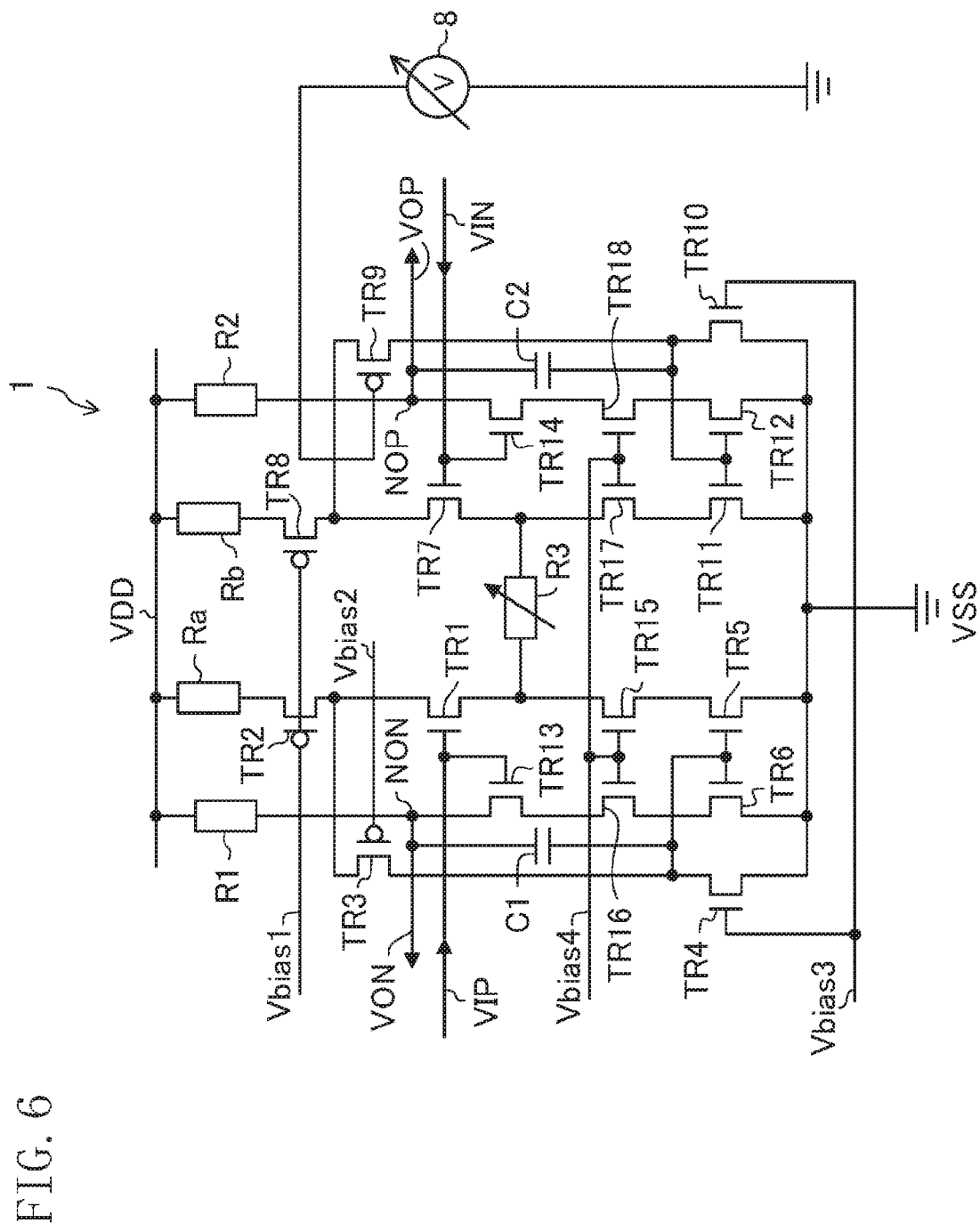
FIG. 6 is a circuit diagram showing a configuration of a low noise amplifier according to a fourth variation of the first embodiment.

FIG. 6 is a circuit diagram showing a configuration of a low noise amplifier according to a fourth variation. The following description of this variation will be focused on the difference between this variation and the variation shown in FIG. 3.

In the low noise amplifier 1 according to this variation, a bias potential to be applied to, e.g., the gate of the transistor TR9 is variable.

Specifically, the gate of the transistor TR3 is supplied with a fixed bias potential $V_{bias2}$, whereas the gate of the transistor TR9 is supplied with a variable bias potential from, e.g., a variable voltage source 8.

As can be seen, this variation allows regulation of the bias potential to be applied to the gate of the p-channel transistor TR9. Thus, even if the amplifier is used in a single input application or the circuit symmetry is lost due to dispersion in performance between respective devices, the distortion characteristics may still be improved.

The bias potential $V_{bias2}$ to be applied to the gate of the transistor TR3 may be variable, and at least one of the bias potential to be applied to the gate of the transistor TR3 or the bias potential to be applied to the gate of the transistor TR9 may be variable.

—Fifth Variation—

Figure 7:
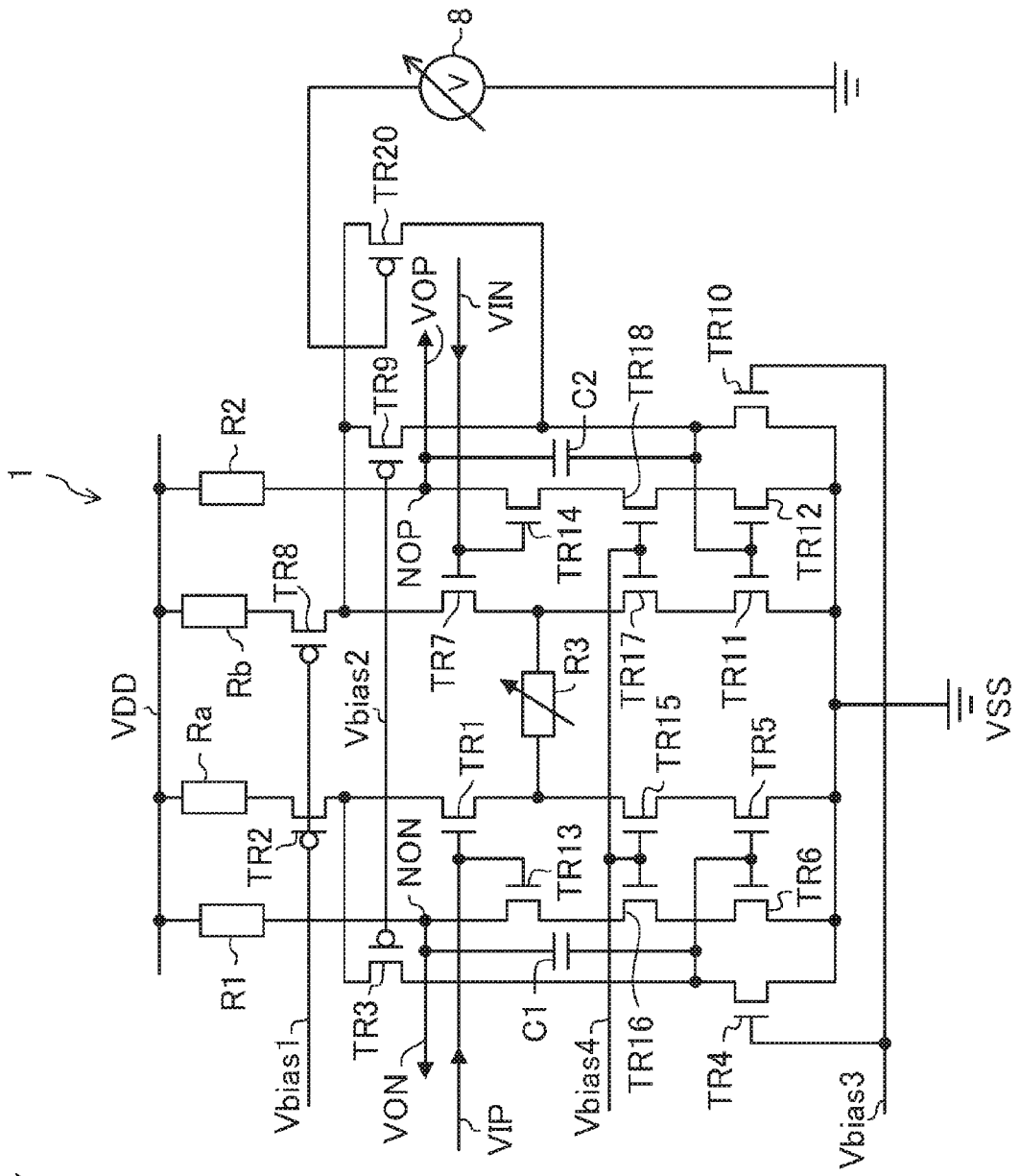
FIG. 7 is a circuit diagram showing a configuration of a low noise amplifier according to a fifth variation of the first embodiment.

FIG. 7 is a circuit diagram showing a configuration of a low noise amplifier according to a fifth variation. The following description of this variation will be focused on the difference between this variation and the variation shown in FIG. 6.

The low noise amplifier 1 according to this variation includes a p-channel transistor TR20 functioning as a twentieth transistor.

The transistor TR9 receives the bias potential $V_{bias2}$ at its gate.

The transistor TR20 is connected in parallel to the transistor TR9, and receives, at its gate, a variable bias potential from the variable voltage source 8.

Optionally, a plurality of transistors TR20 may be connected in parallel to the transistor TR9.

Alternatively, the transistor TR20 may be omitted, and instead, a p-channel transistor functioning as a nineteenth transistor (which will be hereinafter referred to as a transistor TR19 although it is not illustrated) and receiving a variable bias potential at its gate may be connected in parallel to the transistor TR3.

Still alternatively, the transistor TR19 may be connected in parallel to the transistor TR3, and the transistor TR20 may be connected in parallel to the transistor TR9.

As can be seen, if a p-channel transistor to be connected in parallel to at least one of the transistor TR3 or the transistor TR9 receives a variable bias potential as in this variation, optimization may be performed more finely than in the fourth variation. This may further improve the distortion characteristics.

—Sixth Variation—

Figure 8:
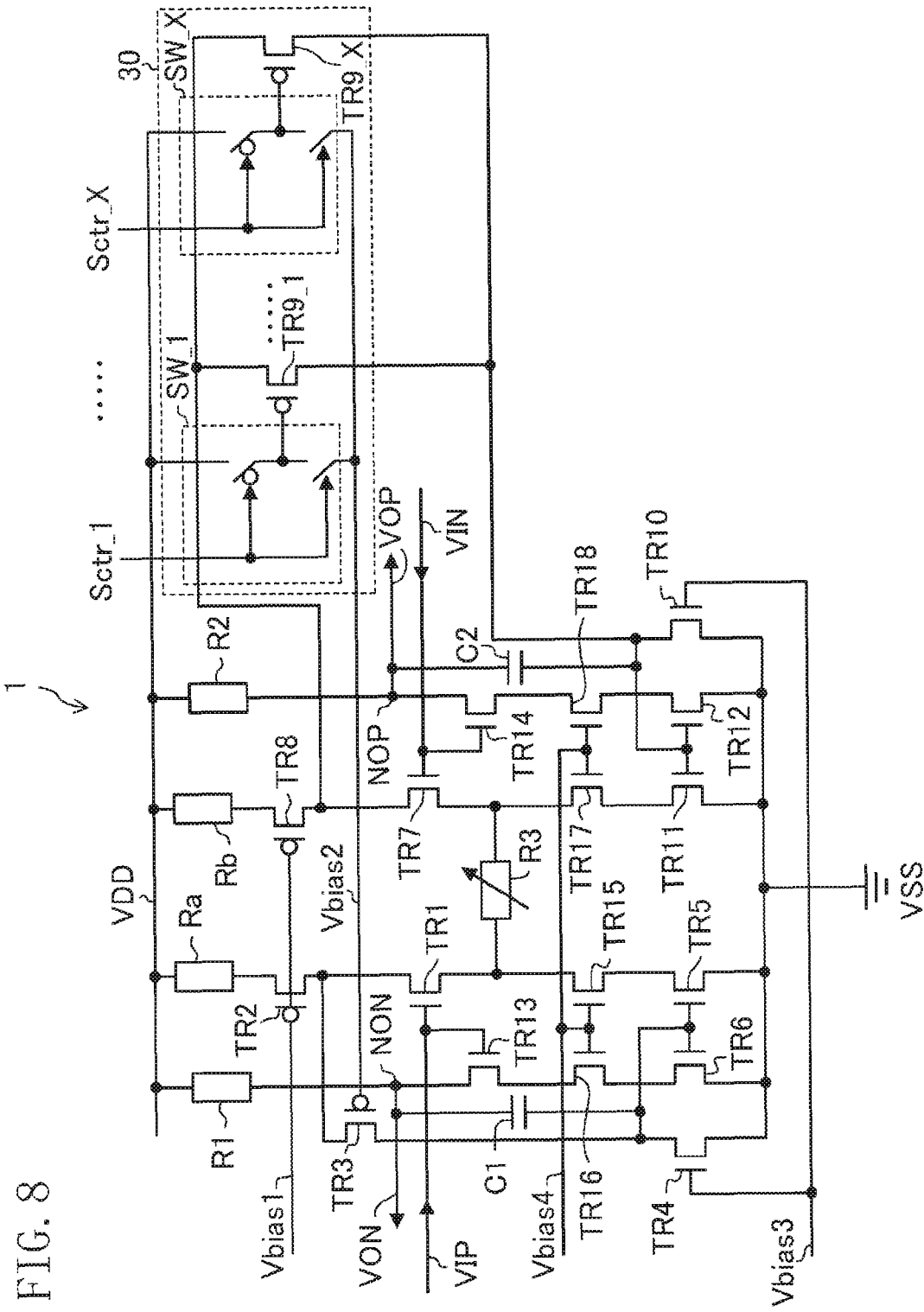
FIG. 8 is a circuit diagram showing a configuration of a low noise amplifier according to a sixth variation of the first embodiment.

FIG. 8 is a circuit diagram showing a configuration of a low noise amplifier according to a sixth variation. The following description of this variation will be focused on the difference between this variation and the variation shown in FIG. 6.

The low noise amplifier 1 according to this variation includes a variable transconductance circuit 30 functioning as a first variable transconductance circuit and including X (where X is an integer equal to or greater than two) p-channel transistors TR9_1-TR9_X (hereinafter simply referred to as "TR9" as appropriate), and switches SW_1-SW_X (hereinafter simply referred to as "SW" as appropriate) associated with the transistors TR9_1-TR9_X, respectively.

The transistors TR9_1-TR9_X are connected together in parallel between the drain of the transistor TR7 and the drain of the transistor TR10. The transistors TR9 each receive, at their gate, the power supply potential VDD or the bias potential $V_{bias2}$ from an associated one of the switches.

The switches SW_1-SW_X are connected together in parallel between the power supply potential VDD and the bias potential $V_{bias2}$, and each output either the power supply potential VDD or the bias potential $V_{bias2}$ in response to an associated one of control signals $S_{ctr\_1}$-$S_{ctr\_X}$ (hereinafter simply referred to as "$S_{ctr}$" as appropriate).

For example, if the control signal $S_{ctr}$ is high, the associated transistor TR9 receives the bias potential $V_{bias2}$ at its gate, and if the control signal $S_{ctr}$ is low, the associated transistor TR9 receives the power supply potential VDD at its gate.

Each of the switches SW may be configured so as to selectively apply, in response to the control signal $S_{ctr}$, the bias potential $V_{bias2}$ to the gate of an associated one of transistors TR9.

As can be seen, according to this variation, control of the switches SW may change the number of the transistors TR9 receiving the bias potential $V_{bias2}$ at their gate. That is to say, the total size of the transistors TR9 to be biased may be variable. This may optimize the transconductance of the transistors TR9, and thereby further improve the distortion characteristics.

In FIG. 8, the variable transconductance circuit 30 may be replaced with a single transistor TR9, and the single transistor 3 may be replaced with a second variable transconductance circuit (which will be hereinafter referred to as a variable transconductance circuit 31, although it is not shown) including a plurality of transistors TR3 and a plurality of switches SW associated with the transistors TR3.

Optionally, both of the variable transconductance circuits 30 and 31 may be provided.

In the first to sixth variations described above, the resistive elements Ra and Rb and the capacitive elements C1 and C2 may be omitted.

In the second to sixth variations described above, the transistors TR13-TR18 may be omitted, as in the first variation.

Second Embodiment

Figure 9:
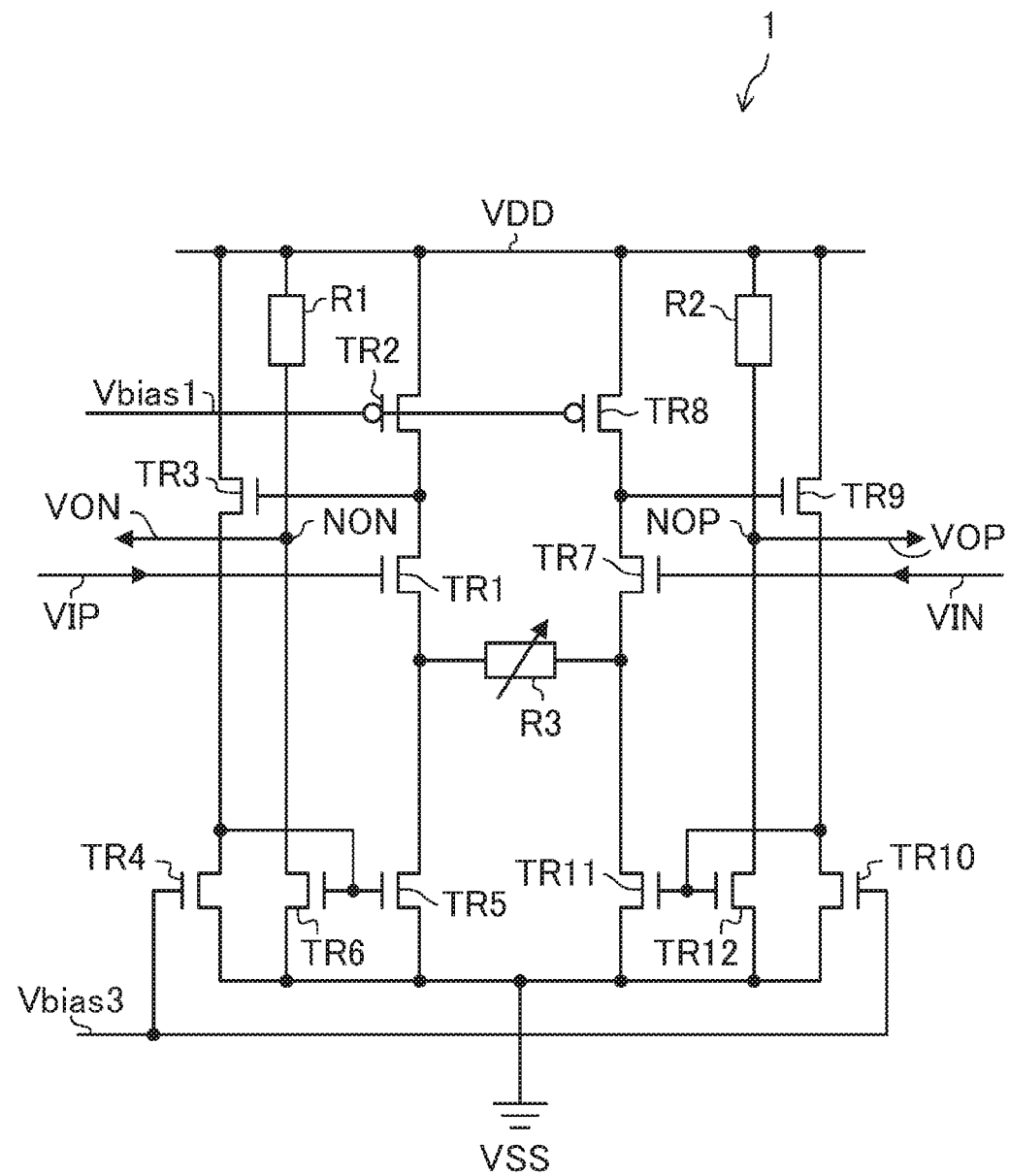
FIG. 9 is a circuit diagram showing a configuration of a low noise amplifier according to a second embodiment.

FIG. 9 is a circuit diagram showing a configuration of a low noise amplifier according to a second embodiment. The following description of this second embodiment will be focused on the difference between this embodiment and the embodiment shown in FIG. 1.

FIG. 9 shows the low noise amplifier 1 according to this embodiment. In this embodiment, the grounded-gate amplifier formed by the p-channel transistors TR3 and TR9 respectively functioning as third and ninth transistors is replaced with a source follower formed by the n-channel transistors TR3 and TR9.

Specifically, in FIG. 9, the transistor TR3 has its gate connected to the drain of the transistor TR1 and the drain of the transistor TR2. The transistor TR3 has its drain connected to the power supply potential VDD, and its source connected to the drain of the transistor TR4.

The transistor TR9 has its gate connected to the drain of the transistor TR7 and the drain of the transistor TR8. The transistor TR9 has its drain connected to the power supply potential VDD, and its source connected to the drain of the transistor TR10.

This configuration may supply the drain voltages of the transistors TR1 and TR2 to the respective gates of the transistors TR5 and TR6 without inverting the voltages. Thus, this configuration may achieve the same or similar advantages as/to the first embodiment. This configuration does not require applying the bias potential $V_{bias2}$ to the gate of the transistors TR3 and TR9, and thus, may eliminate the bias circuit otherwise provided for this purpose.

In this embodiment, in at least one of a pair of the transistors TR1 and TR7 or a pair of the transistors TR3 and TR9, their backgates and sources may be connected together.

Third Embodiment

Figure 10:
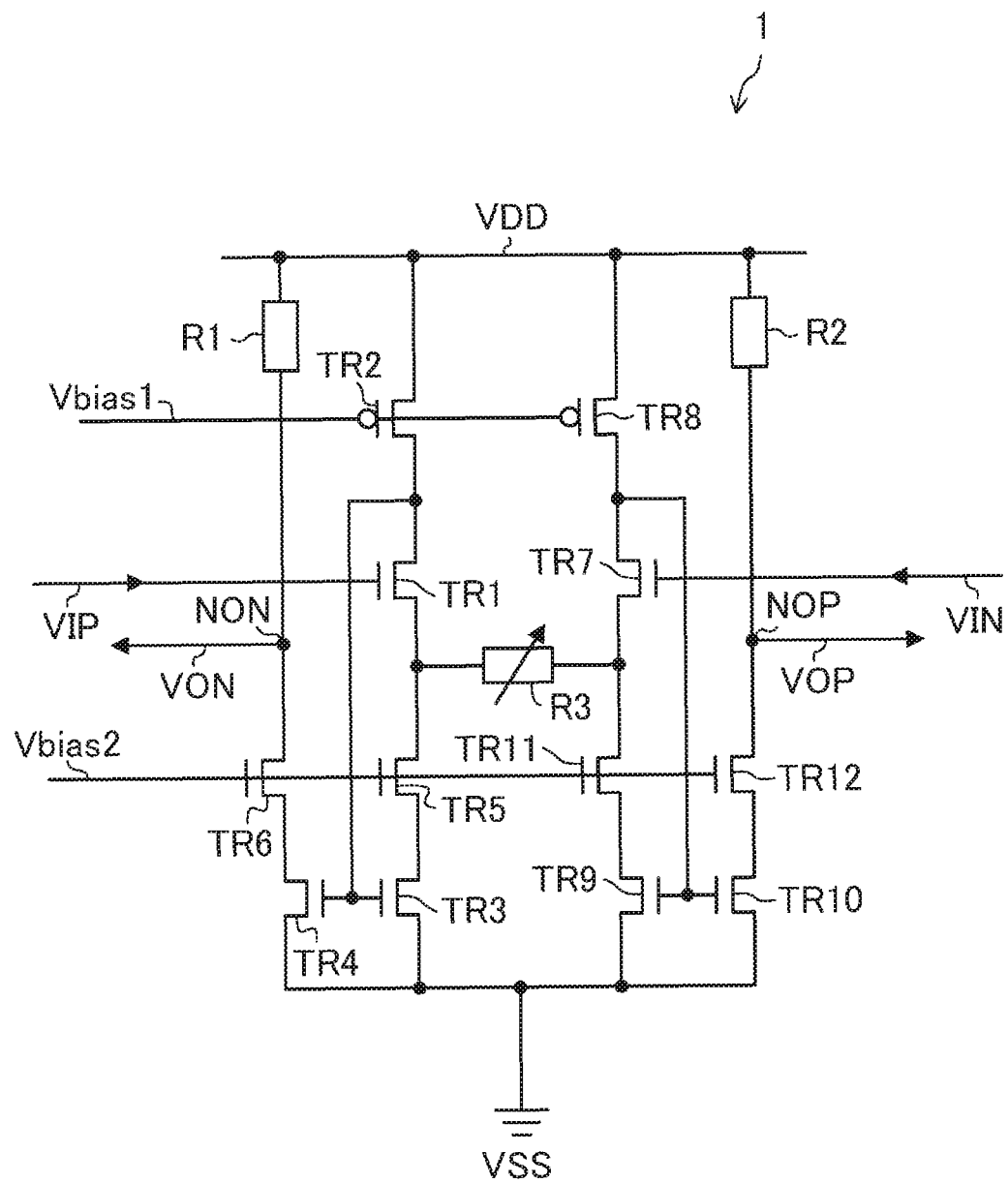
FIG. 10 is a circuit diagram showing a configuration of a low noise amplifier according to a third embodiment.

FIG. 10 is a circuit diagram showing a configuration of a low noise amplifier according to a third embodiment. The following description of this third embodiment will be focused on the difference between this embodiment and the embodiment shown in FIG. 9.

In the low noise amplifier 1 according to this embodiment, the gate of the transistor TR3 is connected to the gate of the transistor TR4, the drain of the transistor TR2, and the drain of the transistor TR1. The transistor TR3 has its drain connected to the source of the transistor TR5, and its source connected to the ground potential VSS.

The transistor TR4 has its drain connected to the source of the transistor TR6, and its source connected to the ground potential VSS.

The transistors TR5 and TR6 each receive, at their gate, the bias potential $V_{bias2}$.

The gate of the transistor TR9 is connected to the gate of the transistor TR10, the drain of the transistor TR8, and the drain of the transistor TR7. The transistor TR9 has its drain connected to the source of the transistor TR11, and its source connected to the ground potential VSS.

The transistor TR10 has its drain connected to the source of the transistor TR12, and its source connected to the ground potential VSS.

The transistors TR11 and TR12 each receive, at their gate, the bias potential $V_{bias2}$.

In the low noise amplifier 1 having such a configuration, the transistors TR3, TR4, TR9, and TR10 operate in a linear region so as to serve as source resistors for their associated transistors TR5, TR6, TR11, and TR12 each functioning as a current source. Their resistance value is controlled by the drain voltages of the transistors TR1 and TR7.

If, for example, the input voltage has changed from VIP=VIN to VIP>VIN, the current IR3 flows through the resistive element R3 in a direction leading from the transistor TR1 toward the transistor TR7. As a result, the amount of current injected into the drain of the transistor TR5 decreases from I1 to I1−IR3. At this time, feedback is performed such that as the drain voltage of the transistor TR1 falls, the value of the resistance caused by the transistor TR3 increases, and the value of the current produced by the current source configured as the transistor TR5 agrees with I1−IR3. On the other hand, the current injected into the drain of the transistor TR11 increases from I7 to I7+IR3. At this time, feedback is performed such that as the drain voltage of the transistor TR7 rises, the value of the resistance caused by the transistor TR9 decreases, and the value of the current produced by the current source configured as the transistor TR11 agrees with I7+IR3.

With the above operation, the low noise amplifier 1 of this embodiment may also achieve the same or similar advantages as/to those of the first and second embodiments. Furthermore, this configuration requires a smaller number of current paths leading from the power supply VDD to the ground VSS, and thereby may further reduce the power consumption.

The first and second variations may be applied to the second and third embodiments.

In each of the transistors TR1 and TR7, their backgate and source may be connected together.

Fourth Embodiment

Figure 11:
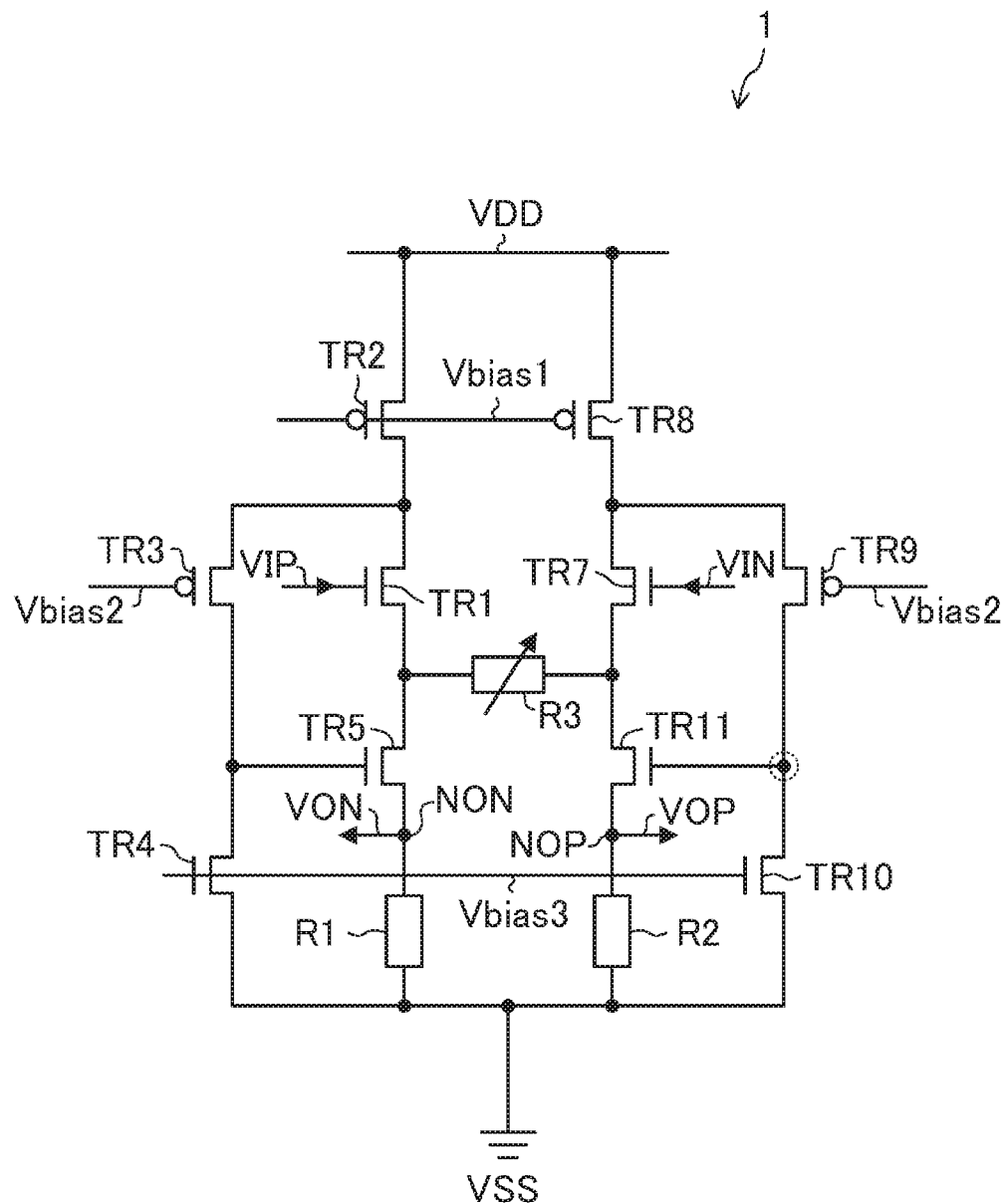
FIG. 11 is a circuit diagram showing a configuration of a low noise amplifier according to a fourth embodiment.

FIG. 11 is a circuit diagram showing a configuration of a low noise amplifier according to a fourth embodiment.

The low noise amplifier 1 according to this embodiment includes an n-channel transistor TR1 functioning as a first transistor, a p-channel transistor TR2 functioning as a second transistor, a p-channel transistor TR3 functioning as a third transistor, an n-channel transistor TR4 functioning as a fourth transistor, an n-channel transistor TR5 functioning as a fifth transistor, an n-channel transistor TR7 functioning as a sixth transistor, a p-channel transistor TR8 functioning as a seventh transistor, a p-channel transistor TR9 functioning as an eighth transistor, an n-channel transistor TR10 functioning as a ninth transistor, an n-channel transistor TR11 functioning as a tenth transistor, a resistive element R1 functioning as a first resistive element, a resistive element R2 functioning as a second resistive element, and a resistive element R3 functioning as a third resistive element.

The transistor TR1 receives the voltage VIP at its gate. The transistor TR1 has its source connected to one terminal of the resistive element R3 and the drain of the transistor TR5, and has its drain connected to the drain of the transistor TR2 and the source of the transistor TR3.

The transistor TR2 receives the bias potential $V_{bias1}$ at its gate. Also, the transistor TR2 has its source connected to the power supply potential VDD, and its drain connected to the source of the transistor TR3.

The transistor TR3 receives the bias potential $V_{bias2}$ at its gate. Also, the transistor TR3 has its drain connected to the drain of the transistor TR4 and the gate of the transistor TR5.

The transistor TR4 receives the bias potential $V_{bias3}$ at its gate. The transistor TR4 has its source connected to the ground potential VSS, and its drain connected to the gate of the transistor TR5.

The transistor TR5 has its source connected to the node NON, and its drain connected to one terminal of the resistive element R3.

The resistive element R1 is connected between the node NON and the ground potential VSS.

The transistor TR7 receives the voltage VIN at its gate. The transistor TR7 has its source connected to the other terminal of the resistive element R3 and the drain of the transistor TR11, and has its drain connected to the drain of the transistor TR8 and the source of the transistor TR9.

The transistor TR8 receives the bias potential $V_{bias1}$ at its gate. Also, the transistor TR8 has its source connected to the power supply potential VDD, and its drain connected to the source of the transistor TR9.

The transistor TR9 receives the bias potential $V_{bias2}$ at its gate. Also, the transistor TR9 has its drain connected to the drain of the transistor TR10 and the gate of the transistor TR11.

The transistor TR10 receives the bias potential $V_{bias3}$ at its gate. The transistor TR10 has its source connected to the ground potential VSS, and its drain connected to the gate of the transistor TR11.

The transistor TR11 has its source connected to the node NOP, and its drain connected to the other terminal of the resistive element R3.

The resistive element R2 is connected between the node NOP and the ground potential VSS.

The resistive element R3 is connected to the source of the transistor TR1 and the source of the transistor TR7.

As can be seen, unlike the configuration of FIG. 1 in which the current flowing through the transistors TR5 and TR11 is allowed to flow into the resistive elements R1 and R2 using a current mirror circuit, the resistive elements R1 and R2 are directly connected to the respective sources of the transistors TR5 and TR6. Therefore, this may reduce the number of current paths between the power supply and the ground, and thereby may further reduce the power consumption. In FIG. 11, the dotted circle indicates a pole in the circuit. That is to say, the low noise amplifier 1 according to this embodiment has a single-pole configuration as in FIG.

1, and may either eliminate a phase compensation capacitor altogether or significantly reduce its capacitance value.

Next, the dynamic range of the low noise amplifier 1 according to this embodiment will now be described as to a situation where the low noise amplifier 1 is operated under the same condition as in the first embodiment. Suppose that definitions of the respective values such as the power supply potential VDD ($V_{val}$) and the gate-source voltage $V_{gn}$ of the transistor TR1 are the same as in the first embodiment.

In the low noise amplifier 1 according to this embodiment, the upper limit $V_{iH}$ and lower limit $V_{iL}$ of the input dynamic range may be given by the following expressions:

$$V_{iH}=V_{val}-V_{dsp}+V_{gn}-V_{dsn} \qquad \text{Expression (7)}$$

$$V_{iL}=V_{oc}+V_{oa}+V_{gn}+V_{dsn} \qquad \text{Expression (8)}$$

If, e.g., $V_{val}$=1.8 V, $V_{dsp}$=0.2 V, $V_{gn}$=0.5 V, $V_{dsn}$=0.2 V, $V_{oc}$=0.32 V, and $V_{oa}$=0.6335/2 are substituted into the Expressions (7) and (8), then $V_{iH}$ and $V_{iL}$ are calculated as follows:

$$V_{iH}=1.8-0.2+0.5-0.2=1.9 \text{ V}$$

$$V_{iL}=0.32+0.6335/2+0.5+0.2=1.34 \text{ V}$$

That is to say, the input dynamic range is from 1.34 V to 1.9 V, i.e., the magnitude of the input dynamic range is 0.56 V. This value falls short of 1.2 V that is the input dynamic range of the circuit of FIG. 1. However, this value is still greater by 0.3 V than 0.26 V that is the input dynamic range of the conventional circuit of FIG. 2. Thus, it can be seen that the amplifier of this embodiment may operate normally even if the peak value of the input signal is 0.5 V. Also, the gain of this configuration is $2R_o/R_i$ since it is equal to the gain in a case where the current mirror ratio is 1 (K=1) in the gain expression in the circuit of FIG. 1. As can be seen, the gain is determined by only the resistance ratio. Thus, the gain may be obtained with high precision and low distortion. Besides, this configuration requires a smaller number of current paths and a smaller number of elements, thus enabling reduction in the power consumption and the circuit area.

In this embodiment, in at least one of the pair of the transistors TR1 and TR7, the pair of the transistors TR3 and TR9, or the pair of the transistors TR5 and TR11, their backgates and the sources may be connected together.

Figure 12:
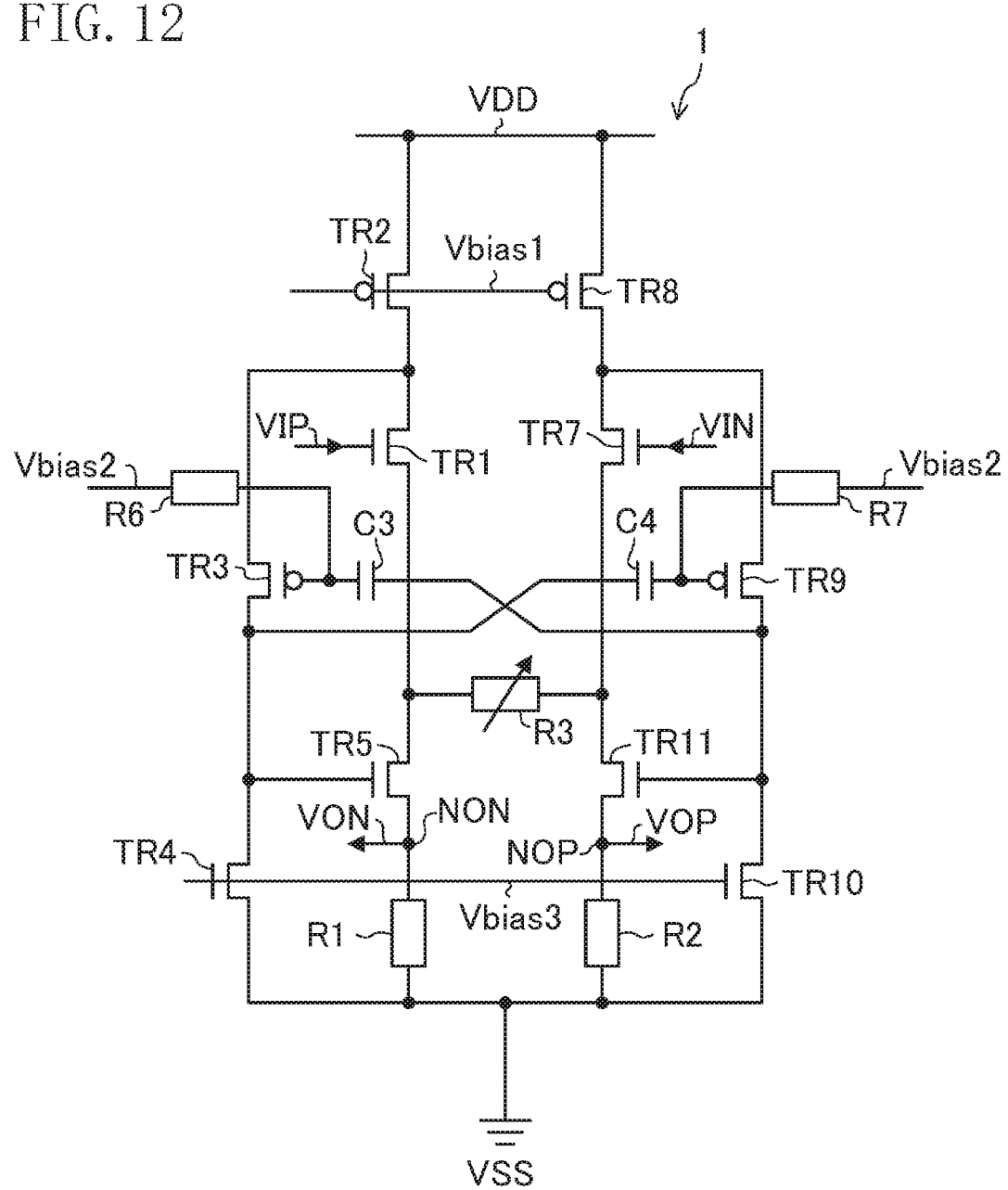
FIG. 12 is a circuit diagram in which the configuration shown in FIG. 5 is applied to a low noise amplifier according to the fourth embodiment.

Also, the configurations of the third to sixth variations of the first embodiment may be applied to this embodiment. For example, a configuration as shown in FIG. 12 may be obtained as a variation of this embodiment if capacitive elements C3 and C4 and resistive element R6 and 7 are added to the low noise amplifier 1 of FIG. 11.

Figure 13:
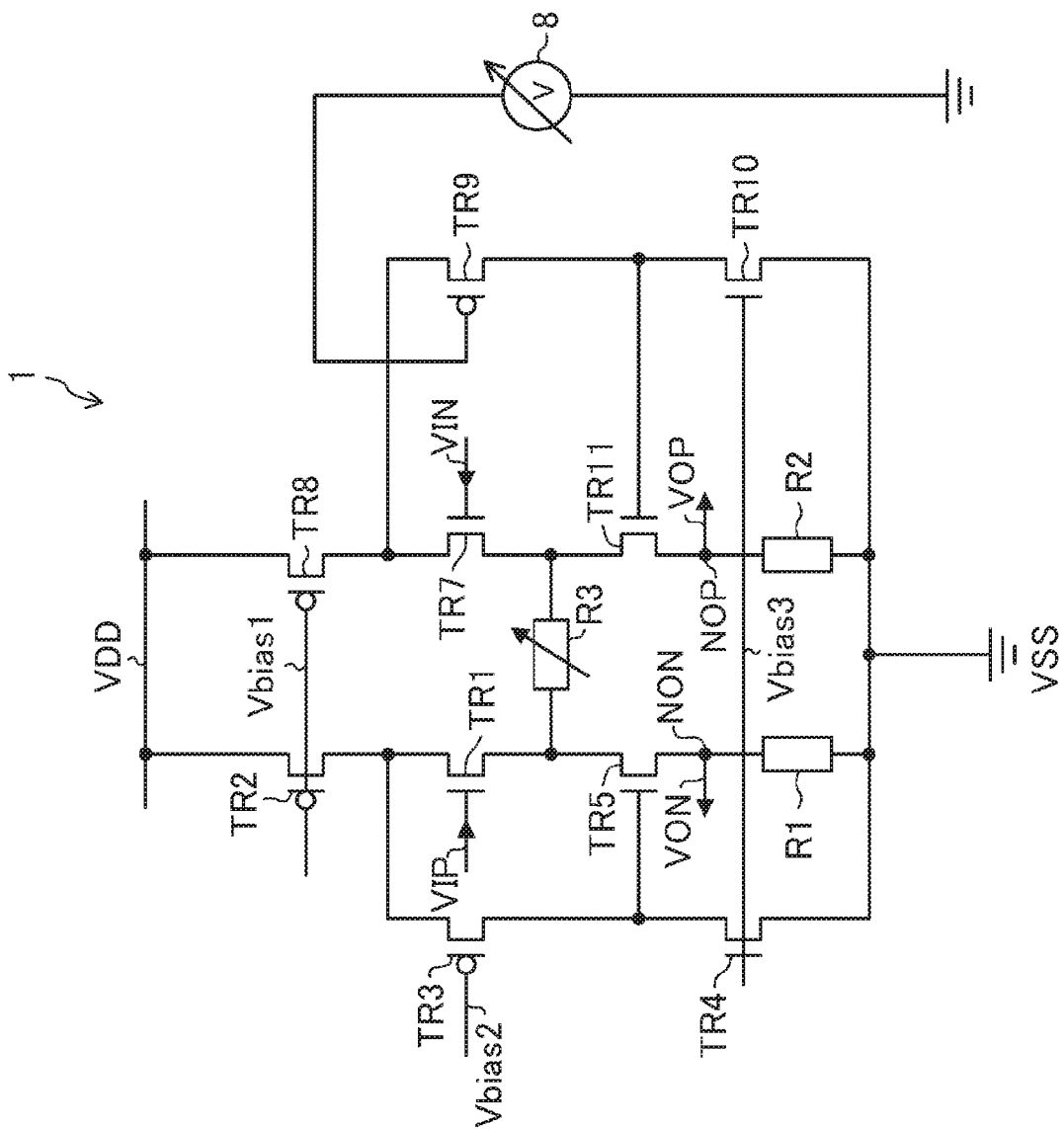
FIG. 13 is a circuit diagram in which the configuration shown in FIG. 6 is applied to a low noise amplifier according to the fourth embodiment.

A configuration as shown in FIG. 13 may be obtained as another variation such that the gate of the transistor TR9 is supplied with a variable bias potential from the variable voltage source 8.

Figure 14:
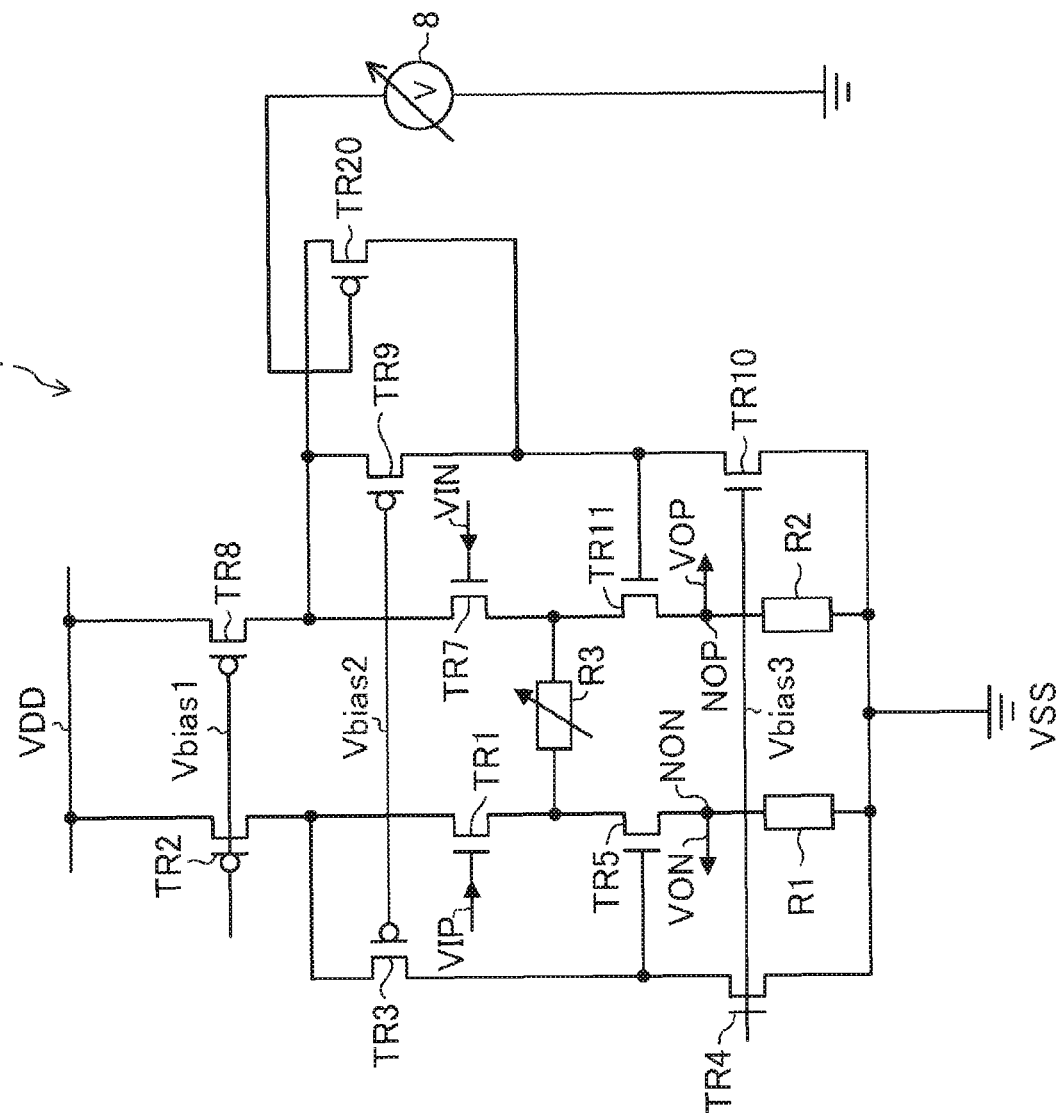
FIG. 14 is a circuit diagram in which the configuration shown in FIG. 7 is applied to a low noise amplifier according to the fourth embodiment.

A configuration as shown in FIG. 14 may be obtained as a yet another variation by the addition of the p-channel transistor TR20 connected in parallel to the transistor TR9, receiving, at its gate, a variable bias potential from the variable voltage source 8, and functioning as an eleventh transistor.

Figure 15:
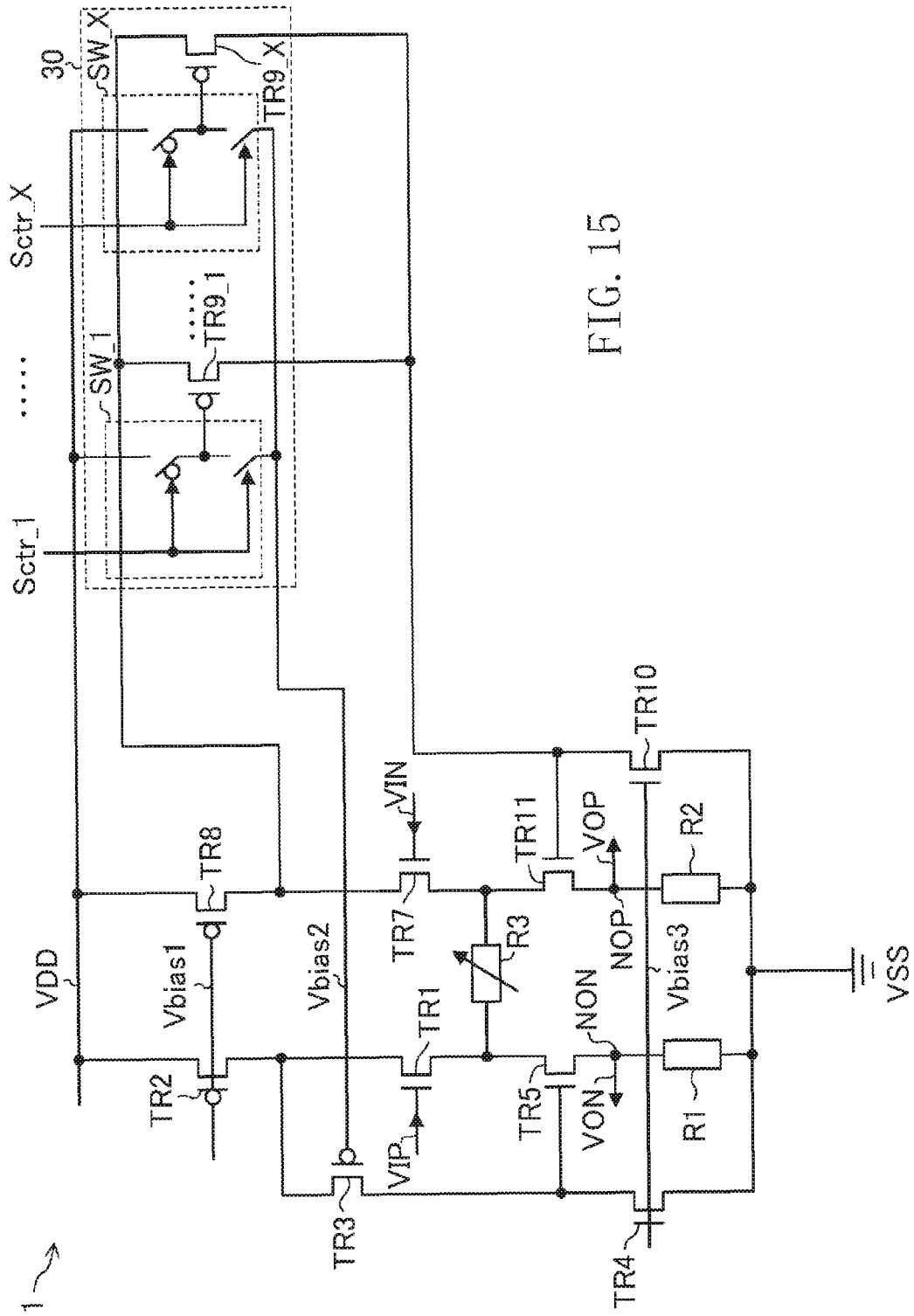
FIG. 15 is a circuit diagram in which the configuration shown in FIG. 8 is applied to a low noise amplifier according to the fourth embodiment.

A configuration as shown in FIG. 15 may be obtained as a still yet another variation by the replacement of the single transistor TR9 with the variable transconductance circuit 30 including the plurality of transistors TR9_1-TR9_X and the switches SW_1-SW_X.

In each of the embodiments described above, the bias potentials $V_{bias1}$-$V_{bias4}$ may be set arbitrarily.

The low noise amplifier according to the present disclosure may not only have excellent noise and distortion characteristics but also operate at an even lower power, and is useful for various electronic devices, such as communications devices, requiring high communication quality.

What is claimed is:

1. A low noise amplifier which receives first and second input signals and outputs first and second output signals, the low noise amplifier comprising:
   a first transistor configured to receive the first input signal at its gate;
   a second transistor having its gate biased, its source electrically connected to a first potential, and its drain electrically connected to a drain of the first transistor;
   a third transistor having its gate biased and its source electrically connected to the drain of the first transistor;
   a fourth transistor having its gate biased, its source electrically connected to a second potential, and its drain electrically connected to a drain of the third transistor;
   a fifth transistor having its gate electrically connected to the drain of the fourth transistor, its source electrically connected to the second potential, and its drain electrically connected to a source of the first transistor;
   a sixth transistor having its gate electrically connected to the drain of the fourth transistor, its source electrically connected to the second potential, and its drain electrically connected to a second output terminal configured to output the second output signal;
   a first resistive element, one terminal of which is electrically connected to the first potential and the other terminal of which is electrically connected to the second output terminal;
   a seventh transistor configured to receive the second input signal at its gate;
   an eighth transistor having its gate biased, its source electrically connected to the first potential, and its drain electrically connected to a drain of the seventh transistor;
   a ninth transistor having its gate biased and its source electrically connected to the drain of the seventh transistor;
   a tenth transistor having its gate biased, its source electrically connected to the second potential, and its drain electrically connected to a drain of the ninth transistor;
   an eleventh transistor having its gate electrically connected to the drain of the tenth transistor, its source electrically connected to the second potential, and its drain electrically connected to a source of the seventh transistor;
   a twelfth transistor having its gate electrically connected to the drain of the tenth transistor, its source electrically connected to the second potential, and its drain electrically connected to a first output terminal configured to output the first output signal;
   a second resistive element, one terminal of which is electrically connected to the first potential and the other terminal of which is electrically connected to the first output terminal; and
   a third resistive element electrically connected to the source of the first transistor and the source of the seventh transistor.

2. The low noise amplifier of claim 1, wherein
in at least one of a pair of the first and seventh transistors or a pair of the third and ninth transistors, their backgates and sources are electrically connected together.

3. The low noise amplifier of claim 1, further comprising:
a thirteenth transistor having its gate electrically connected to the gate of the first transistor, its source electrically connected to the drain of the sixth transistor, and its drain electrically connected to the second output terminal; and
a fourteenth transistor having its gate electrically connected to the gate of the seventh transistor, its source electrically connected to the drain of the twelfth transistor, and its drain electrically connected to the first output terminal.

4. The low noise amplifier of claim 3, wherein
in the first, seventh, thirteenth, and fourteenth transistors and/or the third and ninth transistors, their backgates and sources are electrically connected together.

5. The low noise amplifier of claim 1, further comprising:
a fourth resistive element having one terminal electrically connected to the first potential,
wherein the other terminal of the fourth resistive element, the one terminal of the first resistive element, and the one terminal of the second resistive element are electrically connected together.

6. The low noise amplifier of claim 1, wherein
the gate of the third transistor is electrically connected to the drain of the ninth transistor via a first capacitive element, and
the gate of the ninth transistor is electrically connected to the drain of the third transistor via a second capacitive element.

7. The low noise amplifier of claim 1, wherein
at least one of a bias potential to be applied to the gate of the third transistor or a bias potential to be applied to the gate of the ninth transistor is variable.

8. The low noise amplifier of claim 1, wherein
the third resistive element is a variable resistance element.

9. A low noise amplifier which receives first and second input signals and outputs first and second output signals, the low noise amplifier comprising:
a first transistor configured to receive the first input signal at its gate;
a second transistor having its gate biased, its source electrically connected to a first potential, and its drain electrically connected to a drain of the first transistor;
a third transistor having its gate biased and its source electrically connected to the drain of the first transistor;
a fourth transistor having its gate biased, its source electrically connected to a second potential, and its drain electrically connected to a drain of the third transistor;
a fifth transistor having its gate electrically connected to the drain of the fourth transistor, its source electrically connected to the second potential, and its drain electrically connected to a source of the first transistor;
a sixth transistor having its gate electrically connected to the drain of the fourth transistor, its source electrically connected to the second potential, and its drain electrically connected to a second output terminal configured to output the second output signal;
a first resistive element, one terminal of which is electrically connected to the first potential and the other terminal of which is electrically connected to the second output terminal;
a seventh transistor configured to receive the second input signal at its gate;
an eighth transistor having its gate biased, its source electrically connected to the first potential, and its drain electrically connected to a drain of the seventh transistor;
a ninth transistor having its gate biased and its source electrically connected to the drain of the seventh transistor;
a tenth transistor having its gate biased, its source electrically connected to the second potential, and its drain electrically connected to a drain of the ninth transistor;
an eleventh transistor having its gate electrically connected to the drain of the tenth transistor, its source electrically connected to the second potential, and its drain electrically connected to a source of the seventh transistor;
a twelfth transistor having its gate electrically connected to the drain of the tenth transistor, its source electrically connected to the second potential, and its drain electrically connected to a first output terminal configured to output the first output signal;
a second resistive element, one terminal of which is electrically connected to the first potential and the other terminal of which is electrically connected to the first output terminal;
a third resistive element electrically connected to the source of the first transistor and the source of the seventh transistor;
at least one thirteenth transistor having its gate biased and electrically connected between the source of the first transistor and the drain of the fifth transistor;
at least one fourteenth transistor corresponding to the thirteenth transistor, having its gate biased, and electrically connected between the second output terminal and the drain of the sixth transistor;
at least one fifteenth transistor having its gate biased and electrically connected between the source of the seventh transistor and the drain of the eleventh transistor; and
at least one sixteenth transistor corresponding to the fifteenth transistor, having its gate biased, and electrically connected between the first output terminal and the drain of the twelfth transistor.

10. A low noise amplifier which receives first and second input signals and outputs first and second output signals, the low noise amplifier comprising:
a first transistor configured to receive the first input signal at its gate;
a second transistor having its gate biased, its source electrically connected to a first potential, and its drain electrically connected to a drain of the first transistor;
a third transistor having its gate biased and its source electrically connected to the drain of the first transistor;
a fourth transistor having its gate biased, its source electrically connected to a second potential, and its drain electrically connected to a drain of the third transistor;
a fifth transistor having its gate electrically connected to the drain of the fourth transistor, its source electrically connected to the second potential, and its drain electrically connected to a source of the first transistor;
a sixth transistor having its gate electrically connected to the drain of the fourth transistor, its source electrically connected to the second potential, and its drain electrically connected to a second output terminal configured to output the second output signal;

a first resistive element, one terminal of which is electrically connected to the first potential and the other terminal of which is electrically connected to the second output terminal;

a seventh transistor configured to receive the second input signal at its gate;

an eighth transistor having its gate biased, its source electrically connected to the first potential, and its drain electrically connected to a drain of the seventh transistor;

a ninth transistor having its gate biased and its source electrically connected to the drain of the seventh transistor;

a tenth transistor having its gate biased, its source electrically connected to the second potential, and its drain electrically connected to a drain of the ninth transistor;

an eleventh transistor having its gate electrically connected to the drain of the tenth transistor, its source electrically connected to the second potential, and its drain electrically connected to a source of the seventh transistor;

a twelfth transistor having its gate electrically connected to the drain of the tenth transistor, its source electrically connected to the second potential, and its drain electrically connected to a first output terminal configured to output the first output signal;

a second resistive element, one terminal of which is electrically connected to the first potential and the other terminal of which is electrically connected to the first output terminal;

a third resistive element electrically connected to the source of the first transistor and the source of the seventh transistor; and at least one of a thirteenth transistor receiving a variable bias potential at its gate and electrically connected in parallel to the third transistor or a fourteenth transistor receiving a variable bias potential at its gate and electrically connected in parallel to the ninth transistor.

11. A low noise amplifier which receives first and second input signals and outputs first and second output signals, the low noise amplifier comprising:

a first transistor configured to receive the first input signal at its gate;

a second transistor having its gate biased, its source electrically connected to a first potential, and its drain electrically connected to a drain of the first transistor;

a third transistor having its gate biased and its source electrically connected to the drain of the first transistor;

a fourth transistor having its gate biased, its source electrically connected to a second potential, and its drain electrically connected to a drain of the third transistor;

a fifth transistor having its gate electrically connected to the drain of the fourth transistor, its source electrically connected to the second potential, and its drain electrically connected to a source of the first transistor;

a sixth transistor having its gate electrically connected to the drain of the fourth transistor, its source electrically connected to the second potential, and its drain electrically connected to a second output terminal configured to output the second output signal;

a first resistive element, one terminal of which is electrically connected to the first potential and the other terminal of which is electrically connected to the second output terminal;

a seventh transistor configured to receive the second input signal at its gate;

an eighth transistor having its gate biased, its source electrically connected to the first potential, and its drain electrically connected to a drain of the seventh transistor;

a ninth transistor having its gate biased and its source electrically connected to the drain of the seventh transistor;

a tenth transistor having its gate biased, its source electrically connected to the second potential, and its drain electrically connected to a drain of the ninth transistor;

an eleventh transistor having its gate electrically connected to the drain of the tenth transistor, its source electrically connected to the second potential, and its drain electrically connected to a source of the seventh transistor;

a twelfth transistor having its gate electrically connected to the drain of the tenth transistor, its source electrically connected to the second potential, and its drain electrically connected to a first output terminal configured to output the first output signal;

a second resistive element, one terminal of which is electrically connected to the first potential and the other terminal of which is electrically connected to the first output terminal; and a third resistive element electrically connected to the source of the first transistor and the source of the seventh transistor, wherein:

the low noise amplifier further comprises at least one of a first variable transconductance circuit or a second variable transconductance circuit, the first variable transconductance circuit including a plurality of thirteenth transistors each of which is the third transistor and which are electrically connected together in parallel and a plurality of switches respectively associated with the thirteenth transistors and each configured to selectively apply a bias potential to the gate of an associated one of the thirteenth transistors, and the second variable transconductance circuit including a plurality of fourteenth transistors each of which is the ninth transistor and which are electrically connected together in parallel and a plurality of switches respectively associated with the fourteenth transistors and each configured to selectively apply a bias potential to a gate of an associated one of the fourteenth transistors.

* * * * *